(12) United States Patent
Azrai et al.

(10) Patent No.: US 7,190,210 B2
(45) Date of Patent: Mar. 13, 2007

(54) SWITCHED-CAPACITOR POWER SUPPLY SYSTEM AND METHOD

(75) Inventors: Firas Azrai, Austin, TX (US); Michael Yates, Fayetteville, AR (US); David Nelms, Austin, TX (US)

(73) Assignee: Integral Wave Technologies, Inc., Austin, TX (US)

( * ) Notice: Subject to any disclaimer, the term of this patent is extended or adjusted under 35 U.S.C. 154(b) by 473 days.

(21) Appl. No.: 10/809,080

(22) Filed: Mar. 25, 2004

(65) Prior Publication Data

US 2005/0213267 A1    Sep. 29, 2005

(51) Int. Cl.
*G05F 3/02*    (2006.01)
*H01L 27/108*    (2006.01)

(52) U.S. Cl. ..................... 327/536; 257/298
(58) Field of Classification Search ............... 361/15; 327/535, 536; 323/282; 307/110; 320/166; 257/286, 298, 300, 301, 306
See application file for complete search history.

(56) References Cited

U.S. PATENT DOCUMENTS

| | | | |
|---|---|---|---|
| 4,128,771 A | 12/1978 | Domenico | 307/52 |
| 5,008,799 A | 4/1991 | Montalvo | 363/60 |
| 5,301,097 A | 4/1994 | McDaniel | 363/60 |
| 5,414,614 A | 5/1995 | Fette et al. | 363/59 |
| 5,461,557 A * | 10/1995 | Tamagawa | 363/60 |
| 5,493,249 A | 2/1996 | Manning | 327/540 |
| 5,532,916 A * | 7/1996 | Tamagawa | 363/62 |
| 5,553,030 A | 9/1996 | Tedrow et al. | 365/226 |
| 5,581,454 A | 12/1996 | Collins | 363/59 |
| 5,589,847 A * | 12/1996 | Lewis | 345/98 |
| 5,594,324 A | 1/1997 | Canter et al. | 323/282 |
| 5,627,460 A | 5/1997 | Bazinet et al. | 323/288 |
| 5,642,073 A | 6/1997 | Manning | 327/536 |
| 5,680,300 A | 10/1997 | Szepesi et al. | 363/59 |
| 5,717,318 A | 2/1998 | Matsuda et al. | 323/273 |
| 5,734,291 A | 3/1998 | Tasdighi et al. | 327/537 |
| 5,952,733 A | 9/1999 | Johnston | 307/44 |
| 5,952,952 A | 9/1999 | Choi et al. | 341/172 |
| 5,959,853 A | 9/1999 | Kos | 363/59 |
| 5,973,944 A | 10/1999 | Nork | 363/60 |
| 6,055,168 A | 4/2000 | Kotowski et al. | 363/60 |
| 6,115,266 A | 9/2000 | Matsui et al. | 363/21.13 |
| 6,169,673 B1 | 1/2001 | McIntyre et al. | 363/59 |
| 6,169,680 B1 | 1/2001 | Matsui et al. | 363/21.05 |
| 6,181,123 B1 | 1/2001 | Jou et al. | 323/351 |
| 6,184,594 B1 | 2/2001 | Kushnarenko | 307/109 |
| 6,198,645 B1 | 3/2001 | Kotowski et al. | 363/59 |
| 6,268,716 B1 | 7/2001 | Burstein et al. | 323/272 |
| 6,272,029 B1 | 8/2001 | Hirose | 363/59 |
| 6,281,666 B1 | 8/2001 | Tressler et al. | 323/272 |
| 6,304,068 B1 | 10/2001 | Hui et al. | 323/288 |
| 6,304,467 B1 | 10/2001 | Nebrigic | 363/49 |
| 6,310,792 B1 | 10/2001 | Drobnik | 363/147 |
| 6,320,796 B1 | 11/2001 | Voo et al. | 365/189.09 |
| 6,370,046 B1 | 4/2002 | Nebrigic et al. | 363/60 |
| 6,392,904 B1 | 5/2002 | Bayer et al. | 363/59 |
| 6,411,531 B1 | 6/2002 | Nork et al. | 363/60 |
| 6,414,863 B1 | 7/2002 | Bayer et al. | 363/60 |
| 6,429,632 B1 | 8/2002 | Forbes et al. | 323/282 |

(Continued)

*Primary Examiner*—Adolf Berhane
(74) *Attorney, Agent, or Firm*—Andrews Kurth, L.L.P.

(57) ABSTRACT

A plurality of thin-film capacitors are grouped in phases. A control circuit switches each phase between charging and discharging states devised to supply one or more loads with controlled power.

55 Claims, 32 Drawing Sheets

U.S. PATENT DOCUMENTS

| | | | |
|---|---|---|---|
| 6,438,005 B1 | 8/2002 | Walter | 363/60 |
| 6,440,754 B2 * | 8/2002 | Hayashi et al. | 438/3 |
| 6,452,804 B1 | 9/2002 | Dibene, II et al. | 361/720 |
| 6,483,282 B1 | 11/2002 | Bayer | 323/315 |
| 6,486,728 B2 | 11/2002 | Kleveland | 327/536 |
| 6,504,349 B2 | 1/2003 | Jaworski | 323/280 |
| 6,512,411 B2 | 1/2003 | Meng et al. | 327/536 |
| 6,522,558 B2 | 2/2003 | Henry | 363/60 |
| 6,563,235 B1 | 5/2003 | McIntyre et al. | 307/109 |
| 6,573,695 B2 * | 6/2003 | Shashoua | 323/282 |
| 6,600,296 B2 | 7/2003 | Hazucha | 323/237 |
| 6,636,104 B2 | 10/2003 | Henry | 327/536 |
| 6,643,151 B1 | 11/2003 | Nebrigic et al. | 363/59 |
| 6,661,683 B2 | 12/2003 | Botker et al. | 363/60 |

* cited by examiner

FIG. 1 - PRIOR ART

| PHASE | PROCESS STEPS | | DESCRIPTION/NOTES |
|---|---|---|---|
| 1 | MATERIAL ACQUISITION & PREPARATION | | |
| | Obtain Silicon Wafer | 1 | Standard 8" Silicon (6"for prototype) |
| | Deposit SiO2 | 2 | 0.5-1.0 µm (insulation and adhesion) |
| | BOTTOM METAL DEPOSITION | | |
| | Deposit Titanium | 1 | 200 - 500 Å |
| | Deposit Copper | 2 | 2 microns |
| | Deposit Tantalum | 3 | 2000 Å |
| 2 | DIELECTRIC FORMATION | | |
| | Tantalum Oxide Deposition | 1 | *Anodization* |
| 3 | DIELECTRIC PATTERNING | | MASK 1 |
| | Apply Resist | 1 | Typically 4 microns |
| | Exposure | 2 | Minimum feature size: 20 microns |
| | Develop | 3 | |
| | Etch Tantalum Oxide | 4 | Typically RIE |
| | Etch Tantalum | 5 | Typically RIE |
| | TOP METAL DEPOSITION | | |
| | Deposit Titanium | 1 | 200 - 500 Å |
| | Deposit Copper | 2 | 2 microns |
| | TOP METAL PATTERNING | | MASK 2 |
| | Apply Resist | 1 | Typically 4 microns |
| | Exposure | 2 | Minimum feature size: 20 microns |
| | Develop | 3 | |
| | Etch Copper | 4 | Wet or dry |
| | Etch Titanium | 5 | Wet or dry |
| | Strip Resist | 6 | |
| 4 | PASSIVATION (OPTIONAL) | | |
| | Apply BCB | 1 | |
| | Exposure | 2 | |
| | Develop | 3 | |
| | Cure | 4 | |

FIG. 17

| Input Voltage | Gate Length (Process) | Qg(pC) | Fsw(MHz) |
|---|---|---|---|
| 12 | 0.8 um | >40 | 1-5 |
| 12 | 0.5 um | 27 | 10-20 |
| 5 | 0.5 um | 27 | 10-20 |
| 5 | 0.35 um | 20 | 20-30 |
| 3.3 | 0.35 um | 20 | 20-30 |
| 3.3 | 0.25 um | 10 | 50-60 |
| 3.3 | 0.18 um | 6 | 80-100 |

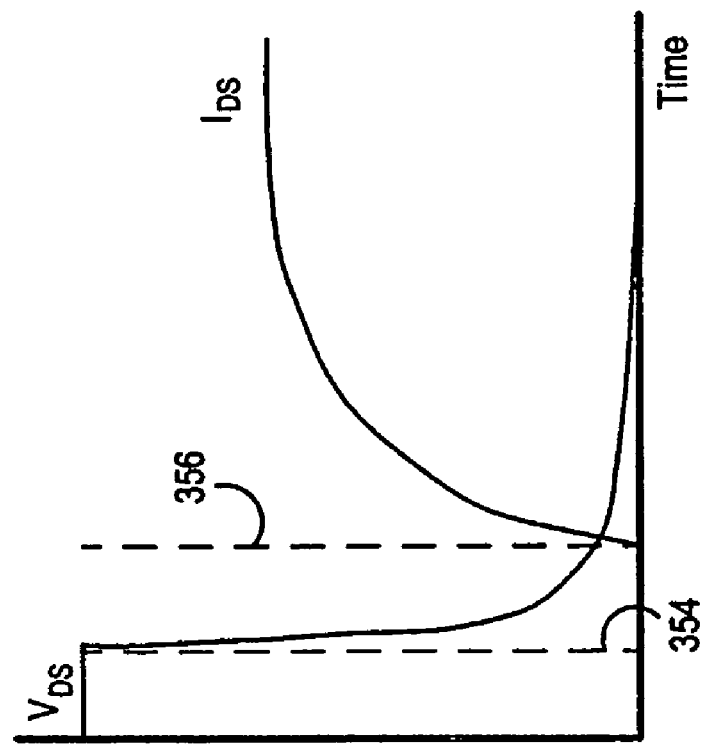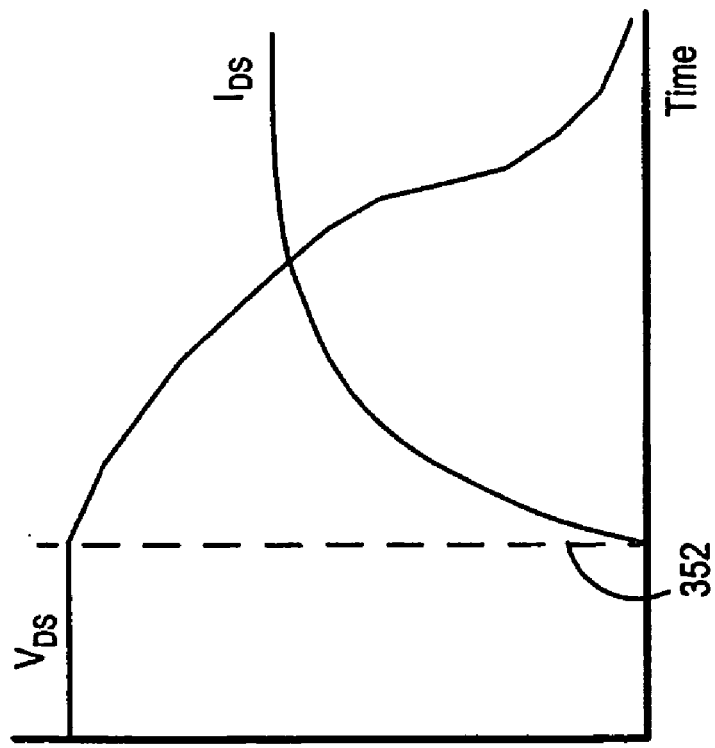
FIG. 32

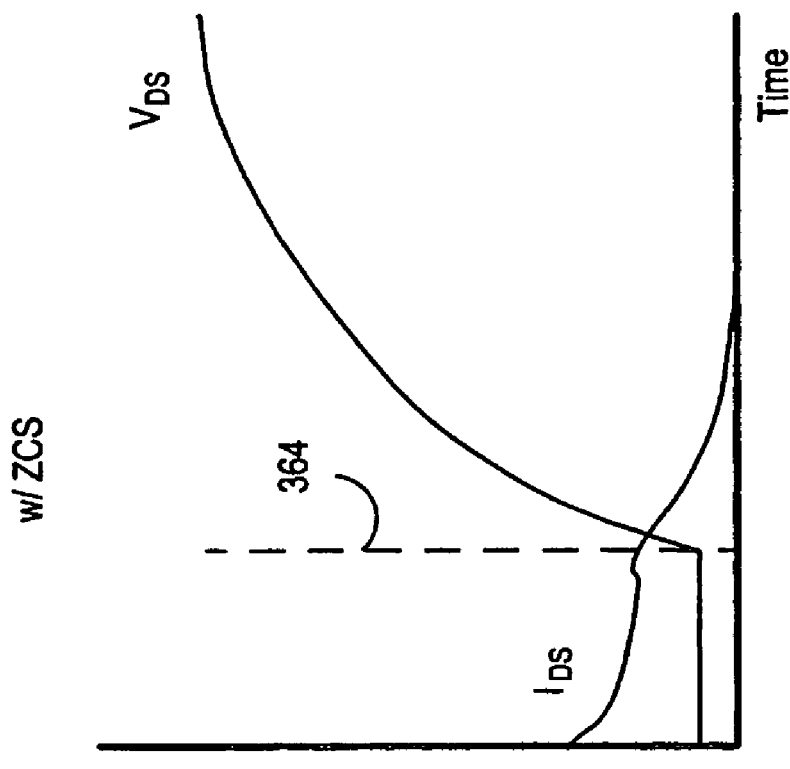
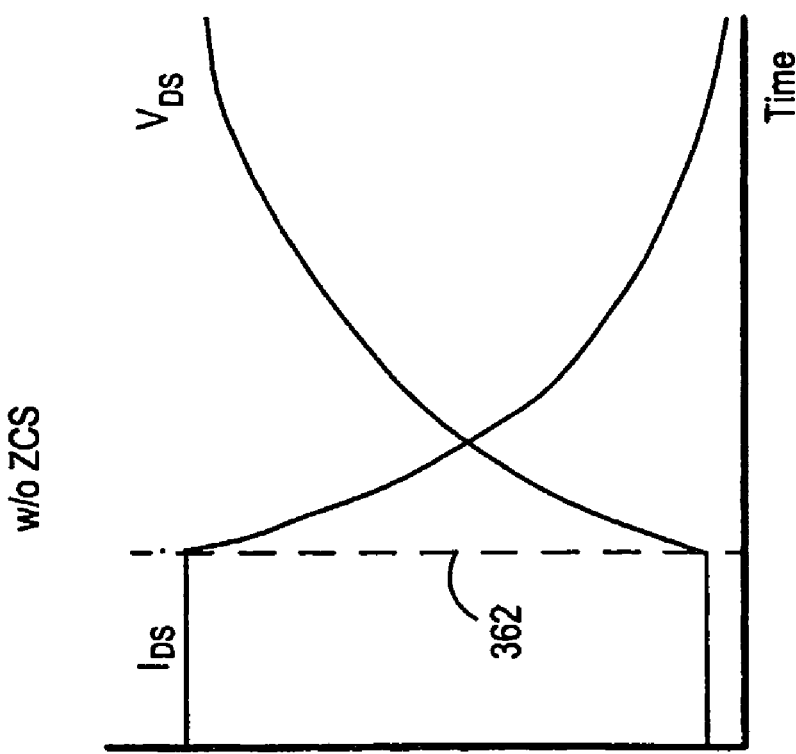
FIG. 33

ND METHOD

SWITCHED-CAPACITOR POWER SUPPLY SYSTEM AND METHOD

TECHNICAL FIELD

The present invention relates to power supplies for integrated circuits, microprocessors, and other high-speed electronic systems.

BACKGROUND OF THE INVENTION

Modern electronic circuits such as, for example, ASICs, FPGAs, and microprocessors, have a broad range of current demands ranging from very high peak currents to relatively low quiescent currents. Although switching regulators can be designed to be highly efficient over a moderate range of load currents, future generations of electronic circuits will probably demand higher maximum output currents and greater dynamic range from power supplies. The modern trends toward increasing numbers of board-level voltage supplies, lower voltages, and smaller circuit board sizes with increased cooling concerns tends to create a growing need to use point-of-load (POL) voltage converters (or as they are called in some embodiments, "voltage regulators"). Further, such trends also tend to create the need to incorporate highly responsive power management control functions within POL converters in order to satisfy load/line requirements.

A synchronous buck switching voltage regulator is a power supply circuit that attempts to provide an output current to a load at a predetermined output voltage. Typical synchronous buck regulators have certain inherent constraints that limit their ability to satisfy the increasing demands of contemporary microprocessors. For example, synchronous buck regulators typically employ series inductors that inhibit high frequency changes in output. Synchronous buck topologies also typically employ high power FETs controlled by circuit drivers. Such designs exhibit large input capacitances that limit switching rates.

Some previously known power supply strategies have coupled in parallel a plurality of switching regulator stages to deliver high output currents to a load such as a microprocessor. Typically, switching transistors are controlled to direct input current into only one regulator stage at a time. Duty ratios in these stages typically decrease as input voltages rise to minimize power plane current while output voltages drop to accommodate faster integrated circuitry and the associated increased derivatives of the power demand curve.

Many modern integrated circuits provide digital feedback signals that convey information about the circuit's power requirements to the power supply. The slow response of synchronous buck topologies and other power supply schemes may introduce instabilities in the feedback loop. Further, many contemporary microprocessors and ASICs turn on or off different parts of the integrated chip or system as needed to conserve power. This increases the demands on the voltage regulator to accommodate changes in load requirements.

What is needed, therefore, is a voltage converter with the ability to source current across a large dynamic range with high speed, stepping and control flexibility and the capability to supply multiple loads with a variety of voltages and currents while exhibiting fast current ramp-up and ramp-down capabilities, dynamic feed-forward and feedback configuration with high efficiency.

SUMMARY OF THE INVENTION

A plurality of capacitors are grouped in one or more controllable phases. In a preferred embodiment, the phases may be further delineated in one or more controllable blocks. A control circuit semiconductor switches each phase between charging and discharging states to supply one or more loads with controlled power.

In a preferred embodiment, a plurality of thin-film capacitors are devised as structures elongated along a plane and disposed about a grouping area. The elongated capacitors are placed proximally to a power management IC which is devised to place capacitor control semiconductor switches in the power management IC substantially aligned with respective capacitor electrodes along an axis substantially perpendicular to the plane of the respectively controlled capacitor.

BRIEF DESCRIPTION OF THE DRAWINGS

FIG. 17 is a graph of certain example parameters of a constant current—constant voltage anodization method according to a preferred embodiment of the present invention.

FIG. 32 depicts low-voltage-switching characteristics according to a preferred embodiment of the present invention.

FIG. 33 depicts low-current-switching characteristics according to a preferred embodiment of the present invention.

DETAILED DESCRIPTION OF PREFERRED EMBODIMENT

Figure 1:
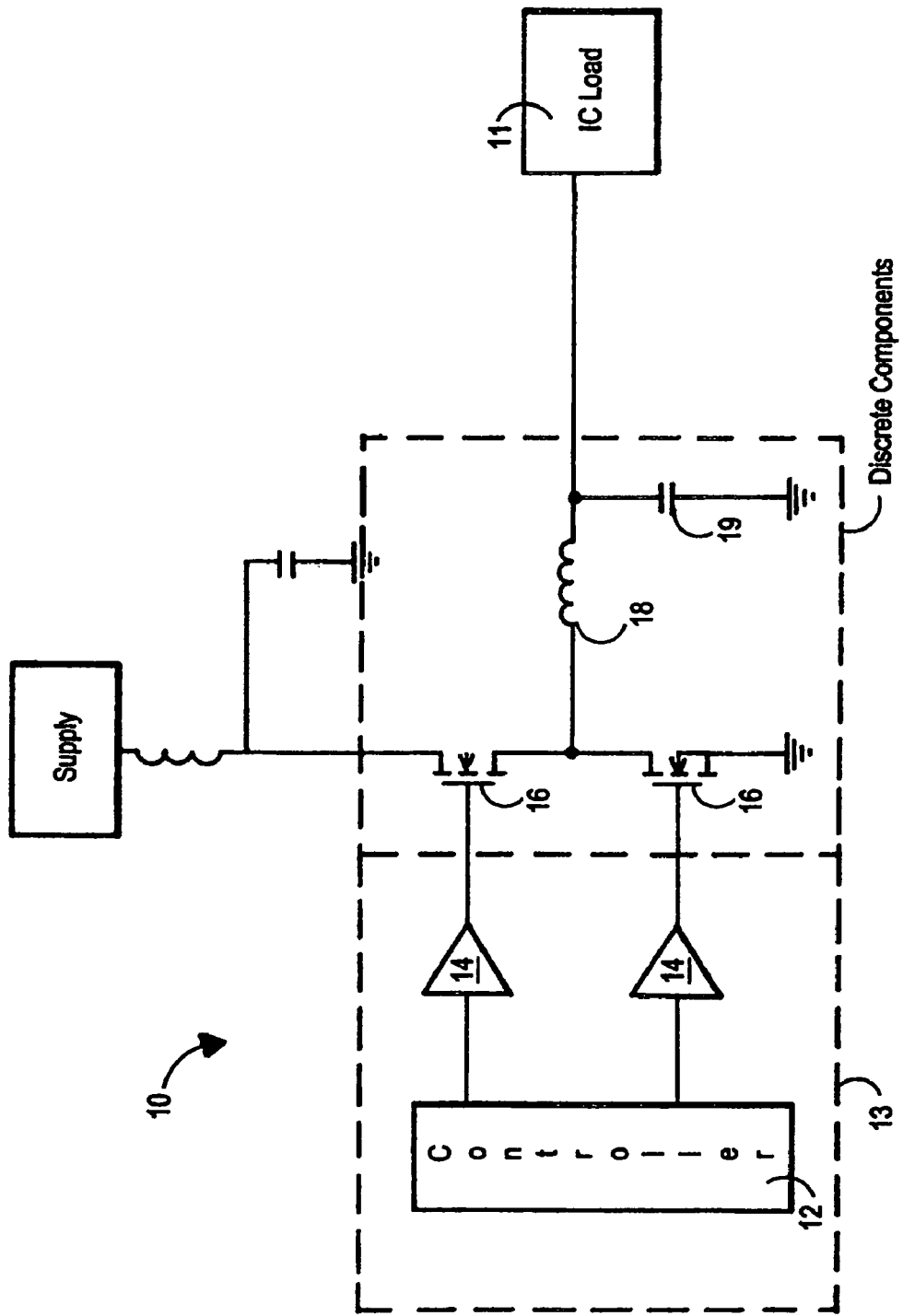
FIG. 1 is a diagram of a prior art power supply system.

FIG. 1 depicts a prior art synchronous buck topology commonly used as a power supply for microprocessors and other demanding loads. Prior art system 10 includes a controller 12 for controlling a pair of drivers 14. Drivers 14 control power FETs 16, which deliver current to series inductor 18 and output capacitor 19. Controller 12 and drivers 14 may be discrete parts, or may be combined into an integrated chip 13, while FETs 16, series inductor 18, and output capacitor 19 are typically large, discrete, board-mounted components. Series inductor 18 and output capacitor 19 store energy for supply to load 11.

Figure 2:
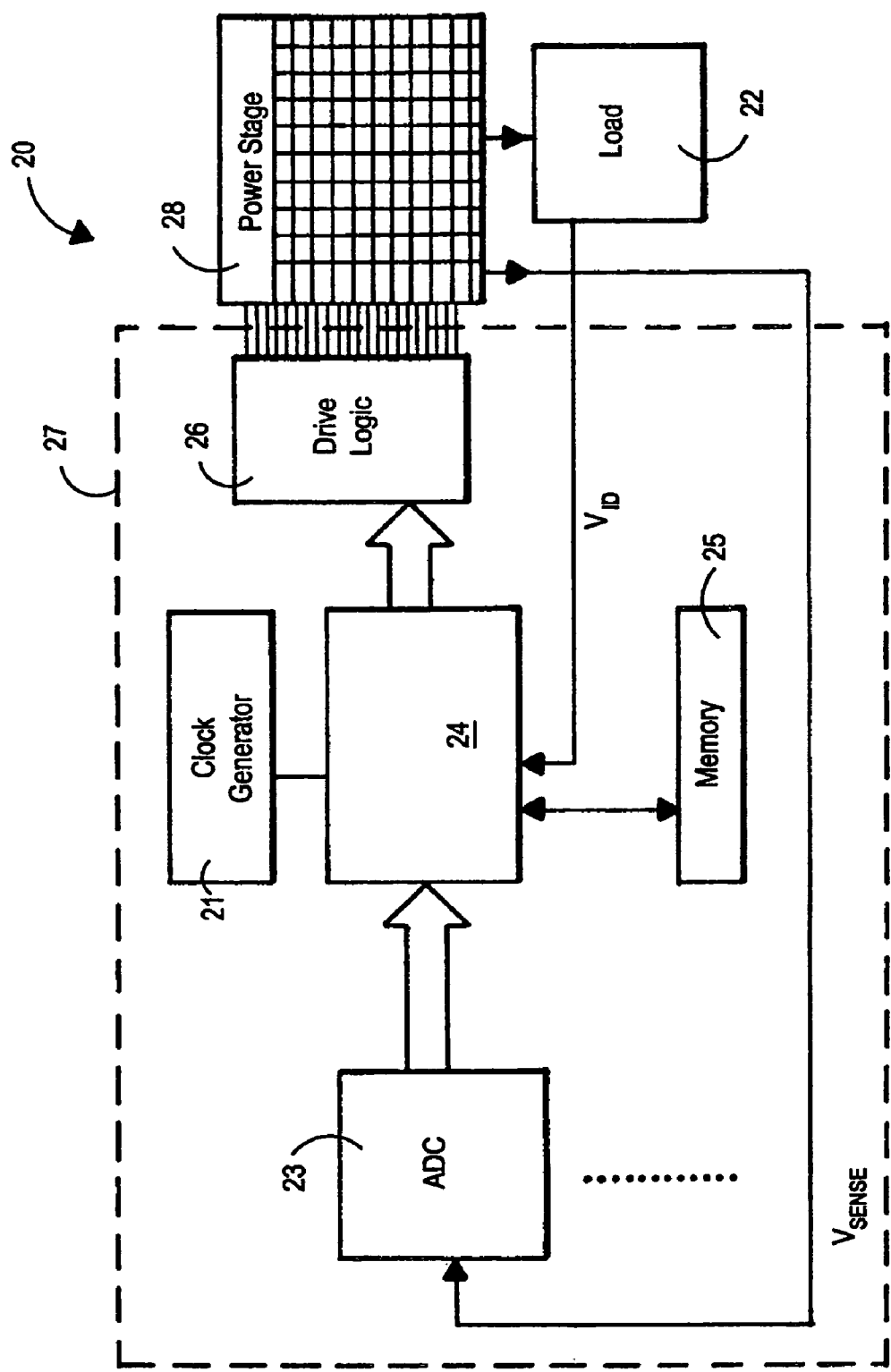
FIG. 2 is a block diagram of one embodiment of the present invention.

FIG. 2 provides a high-level block diagram of one embodiment of the present invention. FIG. 2 shows converter system 20 (or "converter 20") which supplies load 22 with power. Converter system 20 has a control stage 27 and a power stage 28.

In this embodiment, load 22 provides voltage information through signal $V_{ID}$ to control logic 24. Typically signal $V_{ID}$ is carried on a digital bus, but it may also be one or more analog signals. Signal $V_{ID}$ may contain present feedback data and/or future look-ahead data about power requirements of load 22. Signal $V_{ID}$ may present data concerning multiple power islands or power domains or power cells on a single chip such as, for example, a main processor, a floating-point coprocessor, and a standby processor. Further, signal $V_{ID}$ may present data concerning multiple power domains on a system-level chip or board, or may, in alternative embodiments, be multiple $V_{ID}$ signals originating from multiple loads or other data sources such as, for example, a central power controller for a system or IC.

Control logic 24 receives signal $V_{ID}$ and produces output signals to control drive logic 26. Control logic 24 may include a variety of digital control circuits such as, for example, a microprocessor, a DSP, or a look-up-table (LUT), or a combination of circuits. Control logic 24 interacts with memory 25 to operate converter system 20. Drive logic 26 controls power stage 28. Clock generator 21 produces clock signals for control logic 24 to employ in control of converter system 20, including drive logic 26 and power stage 28. Signal $V_{SENSE}$ carries output voltage level data from power stage 28. In a preferred embodiment, analog-to-digital converter (ADC) 23 receives signal $V_{SENSE}$ in analog form and converts it to a digital form suitable for application to control logic 24. Other embodiments may forego ADC 23 when $V_{SENSE}$ is converted from analog form by load 22 or another component of the operating environment into a digital signal that may be applied directly to processor 24. In still other embodiments, no feedback $V_{SENSE}$ signal is employed or needed.

Figure 3:
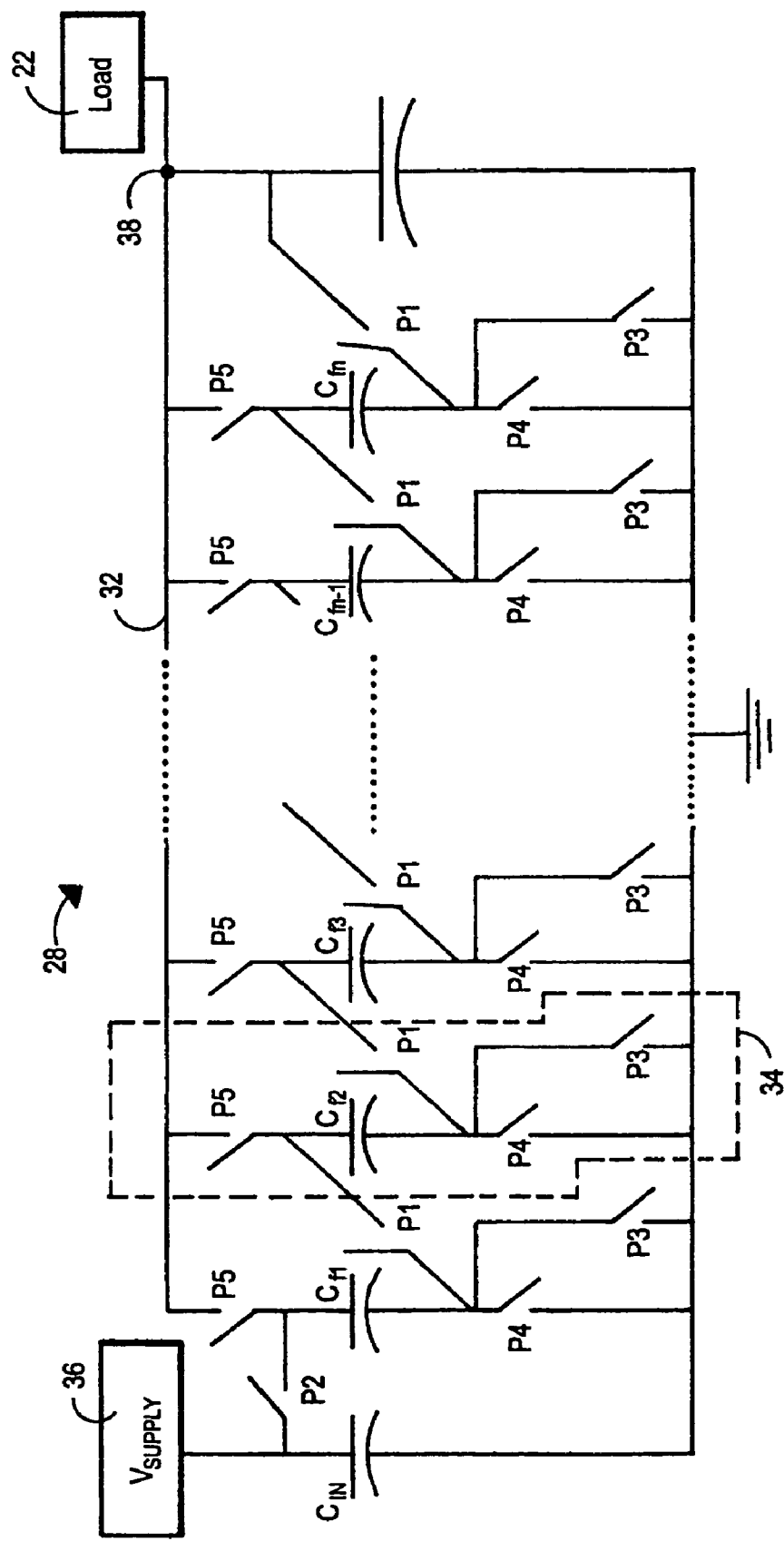
FIG. 3 depicts a capacitor phase circuit of a preferred embodiment of the present invention.
Figure 13:
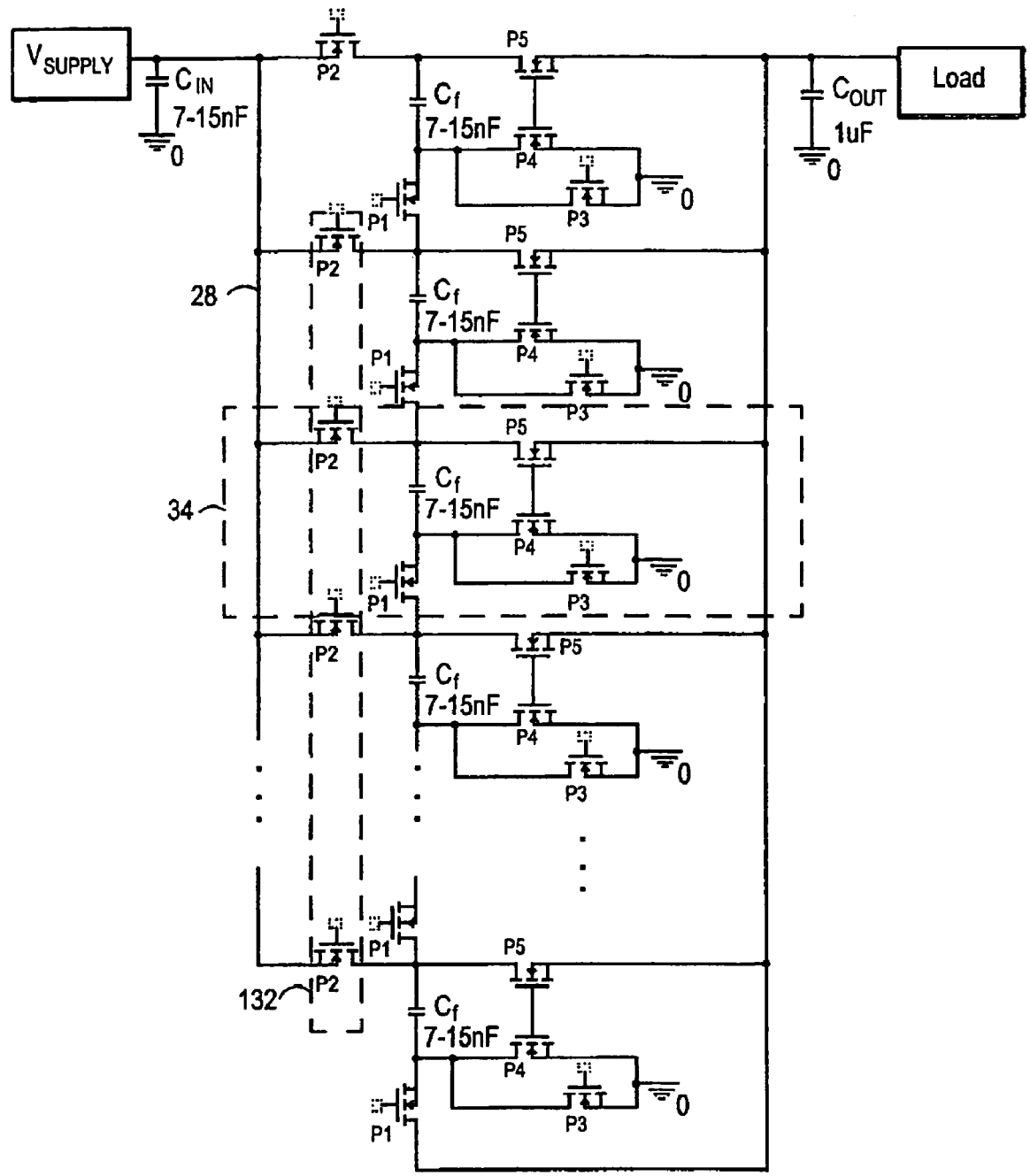
FIG. 13 depicts another power stage according to an alternative embodiment of the present invention.

FIG. 3 is a symbolic depiction of a preferred embodiment of power stage 28 of the present invention. Those of skill will understand that the depiction of FIG. 3 is merely exemplar and the values and topology shown are merely exemplary. Power stage 28 is preferably composed of one or more phases 32 each of which is composed of one or more blocks 34. Phases 32 are preferably arranged in parallel and each phase 32 may include one or more blocks 34. The depicted phase 32 has a semiconductor switch P2 connecting a plurality of blocks 34 of the depicted stage 32 to a supply voltage 36. A block 34 contains one or more iterations of a flying capacitor $C_f$ connected in series to a charging semiconductor switch P1. Capacitors $C_f$ are sometimes referred to as "flying" capacitors because in operation their voltage potential may change or float. Further, although the terminals of capacitors $C_f$ are called positive and negative, this is to identify the terminals and in operation of various embodiments of the invention the actual voltage polarity of the terminals may change. In this embodiment, charging semiconductor switch P1 connects capacitor $C_f$ to the next block 34 in phase 32, and semiconductor switch P1 of the final block 34 connects to output terminal 38 of phase 32. In other embodiments, the capacitor $C_f$ of the final block 34 may instead be connected to ground or another reference potential, with no P1 semiconductor switch or a P1 semiconductor switch or switches may selectively connect the final block 34 to one or more reference potentials or output terminal 38. Those of skill will recognize that semiconductor switches P1–P5 may be implemented with a variety of methods but simple embodiments may even be implemented with discrete semiconductor switches if desired. While some of the Figures referenced herein show FETs, these are exemplar embodiments and the semiconductor switches can be realized with other transistors and/or switches and/or combinations of transistors in series or parallel controlled with appropriate driver circuits. Further, while a particular drain-source orientation is shown in FIG. 13, other orientations may be used for some or all of the semiconductor switches. The preferred implementation is, however, realized with integrated FETs.

In each block 34, discharging semiconductor switch P5 connects the positive terminal of the respective capacitor $C_f$ to output terminal 38. In this embodiment, semiconductor switches P4 and P3 connect the negative terminal of each respective capacitor $C_f$ to ground. In other embodiments, semiconductor switches P4 and P3 may connect to another potential such as, for example, a reference potential voltage to provide a different output voltage than that appearing across capacitors $C_f$.

Preferably, each phase 32 is provided with a de-coupling capacitor $C_{in}$ connected from the positive terminal of semiconductor switch P2 to ground. Power stage 28 may, however, be provided with only one de-coupling capacitor $C_{in}$ connected to the voltage supply 36. Output terminal 38 of phase 32 is connected to an output capacitor $C_{out}$. There is preferably at least one $C_{out}$ for each load serviced by converter system 20.

In operation, each phase 32 charges and then discharges through operation of certain ones of the semiconductor switches P1–P5 in a "charge cycle" and a "discharge cycle". These cycles are controlled through connections from drive logic 26 (shown in FIG. 2) to semiconductor switches P1–P5. The discharge cycle replenishes the voltage on output capacitor $C_{out}$ to provide power to load 22. As will be discussed with regard to later FIG. 6, preferably multiple phases are used with their charge and discharge cycles interleaved or staggered.

During the charge cycle for a phase 32, semiconductor switches P2 and P1 are in an activated state to allow capacitors $C_f$ to charge from voltage supply 36, and semiconductor switches P3, P4, and P5 are deactivated. Current flows from voltage supply 36 through switch P2, to capacitor $C_f$ and switch P1 of each of blocks 34 to the output terminal.

The discharge cycle for a phase 32 commences after blocks 34 have been charged. Semiconductor switches P2 and P1 for each block 34 are de-activated; then switch P3 is activated in order to ground the negative terminals of each capacitor $C_f$ in the selected phase 32. The capacitors $C_f$ in each block are re-connected in parallel by activating semiconductor switches P4 and P5. Capacitors $C_f$ discharge to output capacitor $C_{out}$ and load 22.

Preferably, "dead time" occurs between de-activation of semiconductor switches P1 and P2, and activation of switch P3. This dead time allows the circuit to reach a quiescent state. In a preferred embodiment, total dead time will preferably be a small percentage of the total duration of the charge and discharge cycles for a particular phase 32. The preferred sequence of activating switch P3 before activating semiconductor switches P4 and P5 reduces the voltage across semiconductor switches P4 and P5 prior to their activation. This reduces switching losses and hot carrier degradation. Because the current across semiconductor switch P3 will be relatively low, in some embodiments it may be operated with a higher on resistance than the other semiconductor switches.

After the discharge cycle, the phase is re-configured to the charge cycle state. Semiconductor switches P3, P4, and P5 deactivate, then semiconductor switches P1 and P2 activate. Preferably, switch P1 activates prior to switch P2 to reduce the voltage across switch P2 to approximately zero volts before switch P2 activates. In this embodiment, after each switch P1 activates, switch P2 activates to commence the re-charging of capacitors $C_f$ in phase 32. In other embodiments, switches P2 and P1 may activate simultaneously or in another sequence.

The charge and discharge cycles are used to supply power to load 22. Typically, the amount of capacitance required in power stage 28 decreases as the speed of repeating the charge and discharge cycles (the "switching frequency") increases. A preferable switching frequency is at 5 MHz or above. Preferably, semiconductor switches P1–P5 are fabricated using, for example, a standard merchant CMOS process. Further, semiconductor switches P1–P5 preferably have an input capacitance of 1.75 pF or less. To mitigate the deleterious effects of high voltage across the semiconductor switches, some or all of semiconductor switches P1–P5 may be implemented as a series of two, three, or more transistors connected in series. Further, in some embodiments, some or all of switches P1–P5 may be implemented as a parallel switch including two transistors in parallel, with properties similar to those described with reference to switches P3 and P4 operating in parallel.

Decreases in the series resistance, series inductance, and leakage of capacitors $C_f$ tend to increase the efficiency of power stage 28. Preferably, capacitors $C_f$ are capacitors having an equivalent series resistance (ESR) of less than 100 milliohms and an equivalent series inductance (ESL) of less than 20 pH. In other embodiments, each $C_f$ may have an ESR of 1 milliohm or less, and an ESL of 1 pH or less. In a preferred embodiments, capacitors $C_f$ are thin-film capacitors implemented on a common substrate, but in other embodiments may be discrete thin-film capacitors or other types of capacitors, discrete or integrated on a common substrate or a plurality of substrates.

Figure 4:
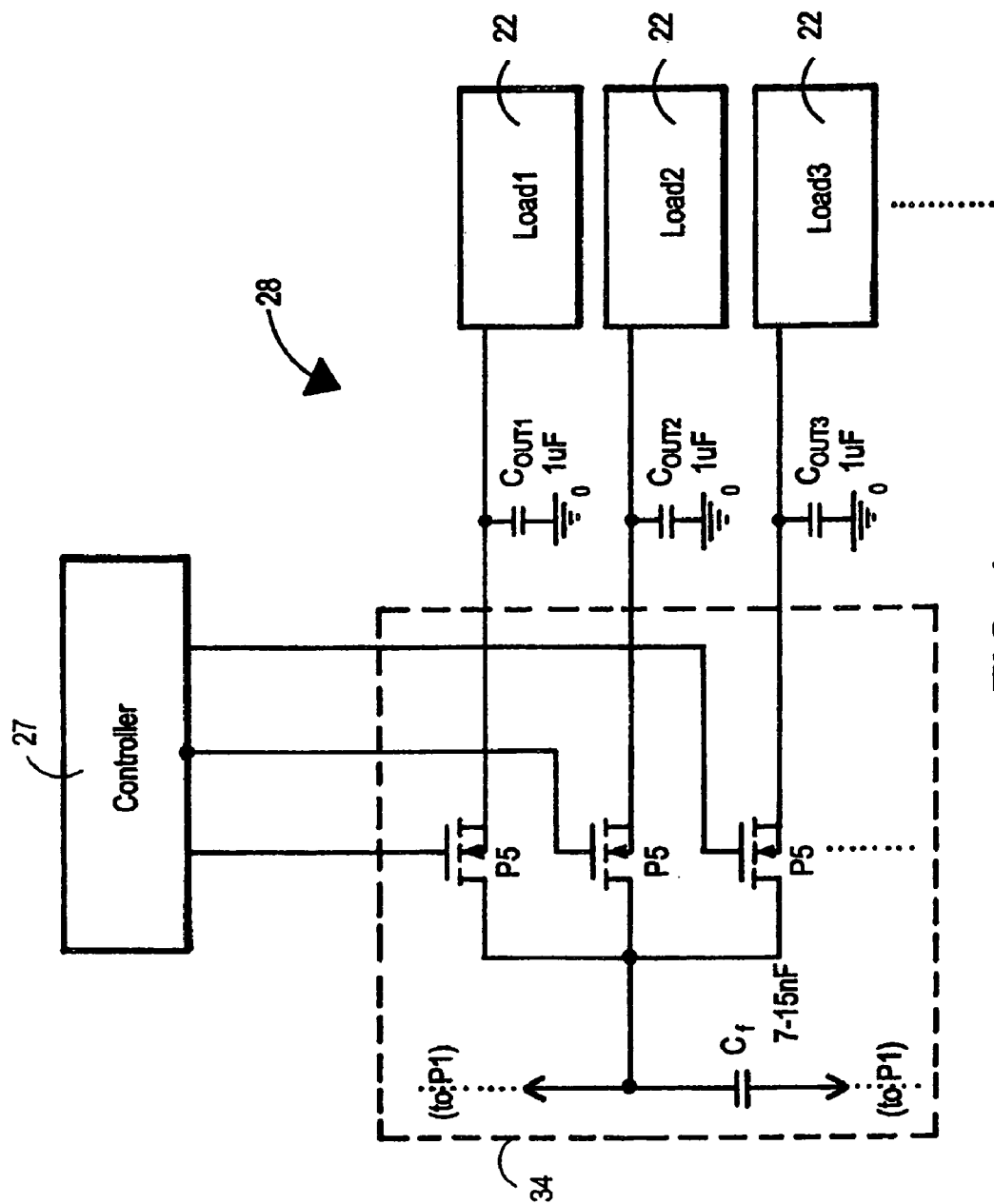
FIG. 4 depicts a multiple load configuration of one embodiment of the present invention.

FIG. 4 depicts an alternative embodiment of the present invention with a multiple load configuration. Control stage 27 generates control signals for block 34. Block 34 has semiconductor switches P5 connecting capacitor $C_f$ to each load 22. The depiction of FIG. 4 illustrates only the top portion of one block 34 having additional P5 semiconductor switches. Other blocks 34, if present, and other phases 32, if present, of power stage 28 are not shown in FIG. 4 to simplify the illustration but are indicated by arrows directed toward respective P1 semiconductor switches on divergent sides from the depicted $C_f$. There are three loads shown, with three P5 semiconductor switches connecting the respective loads to capacitor $C_f$. There may be, however, a variety of arrangements with one, two, three, or more loads.

Figure 5:
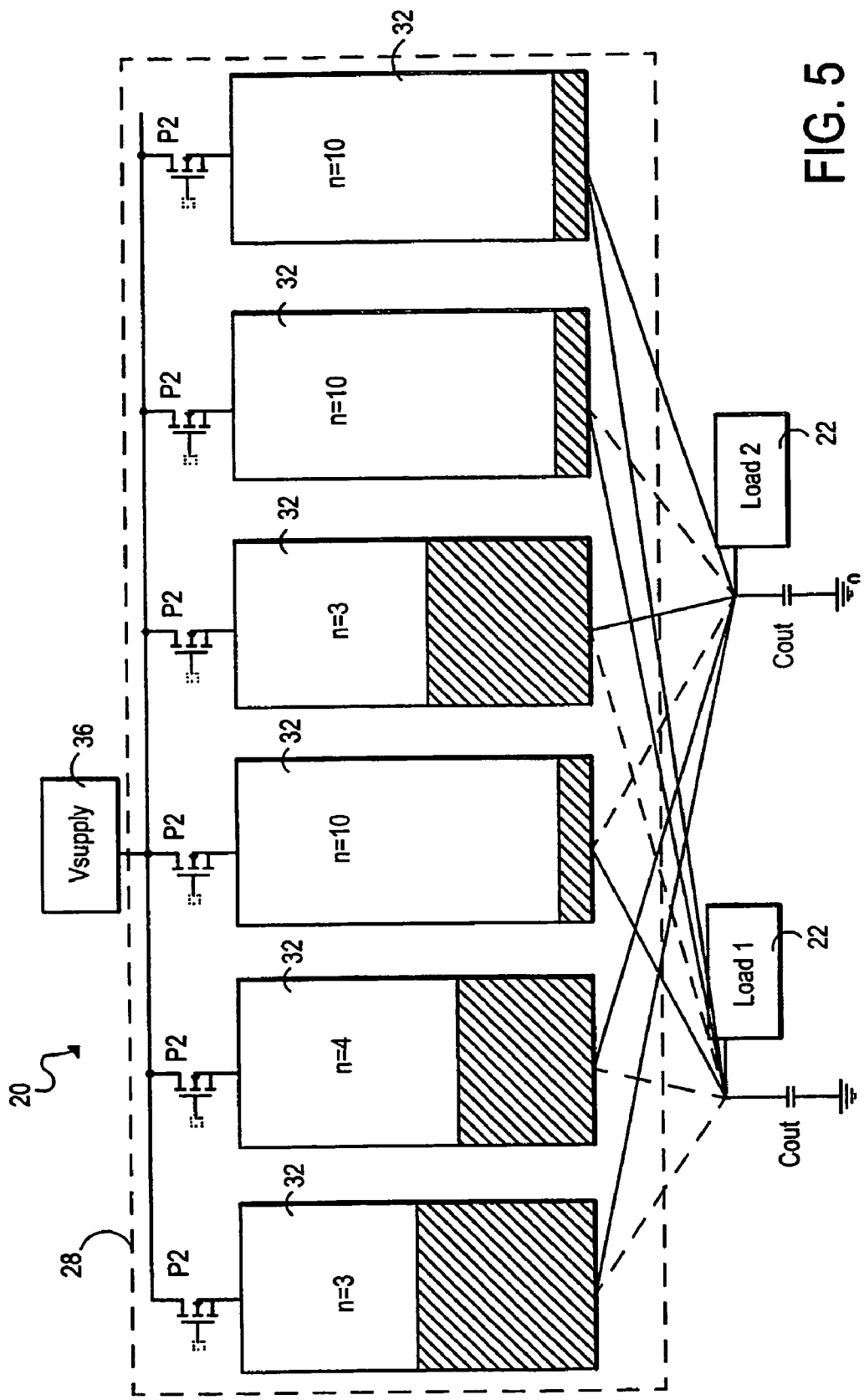
FIG. 5 depicts an exemplar flexible load and phase configuration of one embodiment of the present invention.

FIG. 5 depicts another alternative embodiment in which multiple phases 32 supply multiple loads 22 in a "massively parallel" configuration. A single power stage 28 may supply multiple loads by connecting one or more phases to one or more loads, and controlling the phases in a charge-discharge sequence that is tailored for each load. Different load currents may be achieved by changing the number of phases 32 supplying a particular load 22. Further, different load voltages may be achieved by changing the number ("n") of blocks 34 used in phases 32, or by changing the number of phases ("m") used.

Number "n" may be fixed during initialization of the system in many ways such as, for example, application-based microprogramming of the controller after fabrication. Number "n" may also be dynamically adjusted based on parameters such as supply characteristics, voltage out characteristics, load feedback, and load feed-forward information. A preferred manner of adjusting number "n" for a phase 32 will be described with respect to later FIGS. 6 and 13. The shaded areas in phases 32 graphically represent blocks 34 (shown in FIGS. 3 and 4) within each phase 32 which are not being used in operation in the exemplar operating state depicted. Such unused or unallocated blocks serve as a reserve available to control stage 27 for responding to changes in operating conditions such as, for example, transients on the input voltage supply to power stage 28 or changes in power consumption of load 22. The reserved blocks 34 can be maintained pre-charged (ready to produce ramp-up in the load) or pre-discharged (ready to produce ramp-down in the load).

Phases 32 are connected in parallel to the voltage supply 36 by activating switch P2 of each selected phase 32. Control stage 27 responds to requirements for a particular load 22 by connecting (or disconnecting) phases 32 to load 22 and a respective output capacitor $C_{out}$. This connect/disconnect process is preferably implemented by control stage 27's activation/de-activation of the respective semiconductor switches P5 connected to each load 22, as described with regard to FIG. 4. An exemplar connection status for the loads 22 is shown by solid lines representing phase 32 connection and dashed line representing a phase 32 disconnection. A particular phase 32 may supply, typically in combination with other phases 32, one or more loads 22 by activating, for each active block, one or more of the P5 semiconductor switches (FIG. 4). Further, phases 32 with different values of number "n" may supply the same load 22. Those of skill in the art will understand, after appreciating this specification, that using multiple phases 32 with different values for number "n" may be devised to supply a voltage averaging function between voltages supplied by the phases 32.

While loads 22 are shown as separate entities, converter system 20 may supply a variety of loads having a variety of formats. For example, loads 22 could be multiple ICs on a system, and/or multiple power domains within a single IC, and/or multiple cells within power domains on a single IC. Further, converter system 20 may be employed to achieve efficient power management to control each load 22 individually using such techniques as adjusting supplied voltages and currents for individual loads 22 or turning off power supplied to selected loads 22.

Figure 6:
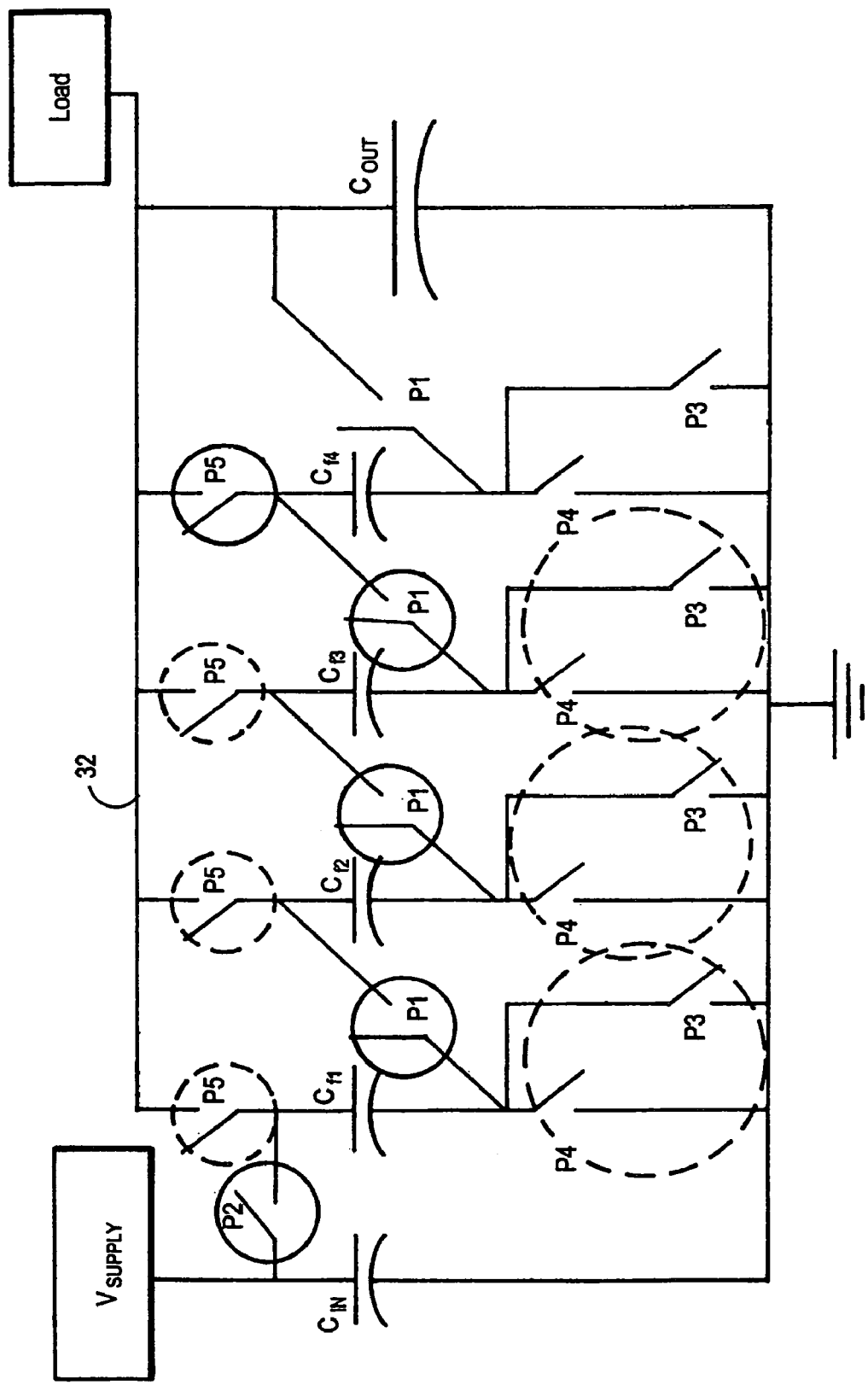
FIG. 6 depicts an exemplar phase employed in another embodiment of the present invention.

FIG. 6 is a depiction of an embodiment of a phase 32 of the present invention with markings to indicate a technique by which control stage 27 may adjust the number of active blocks 34. During converter operation, control stage 27 may modify the role of certain semiconductor switches in phase 32 to, for example, change the voltage output. For example, in FIG. 6, semiconductor switches P1 and P2, enclosed in solid circles, are activated during the charge cycle. Dashed circles surround certain semiconductor switches P3, P4, and P5 which are activated for the discharge cycle. When less than all blocks 34 are used in phase 32, the switch P5 of the first unused block 34 in the series, formerly activated during the discharge cycle, is now activated during the charge cycle. The P1, P2, and P4 semiconductor switches of unused blocks 34, in this example the block 34 at the bottom of FIG. 6, may be kept deactivated or controlled in a manner devised to maintain the blocks in a charged or uncharged state.

Figure 7:
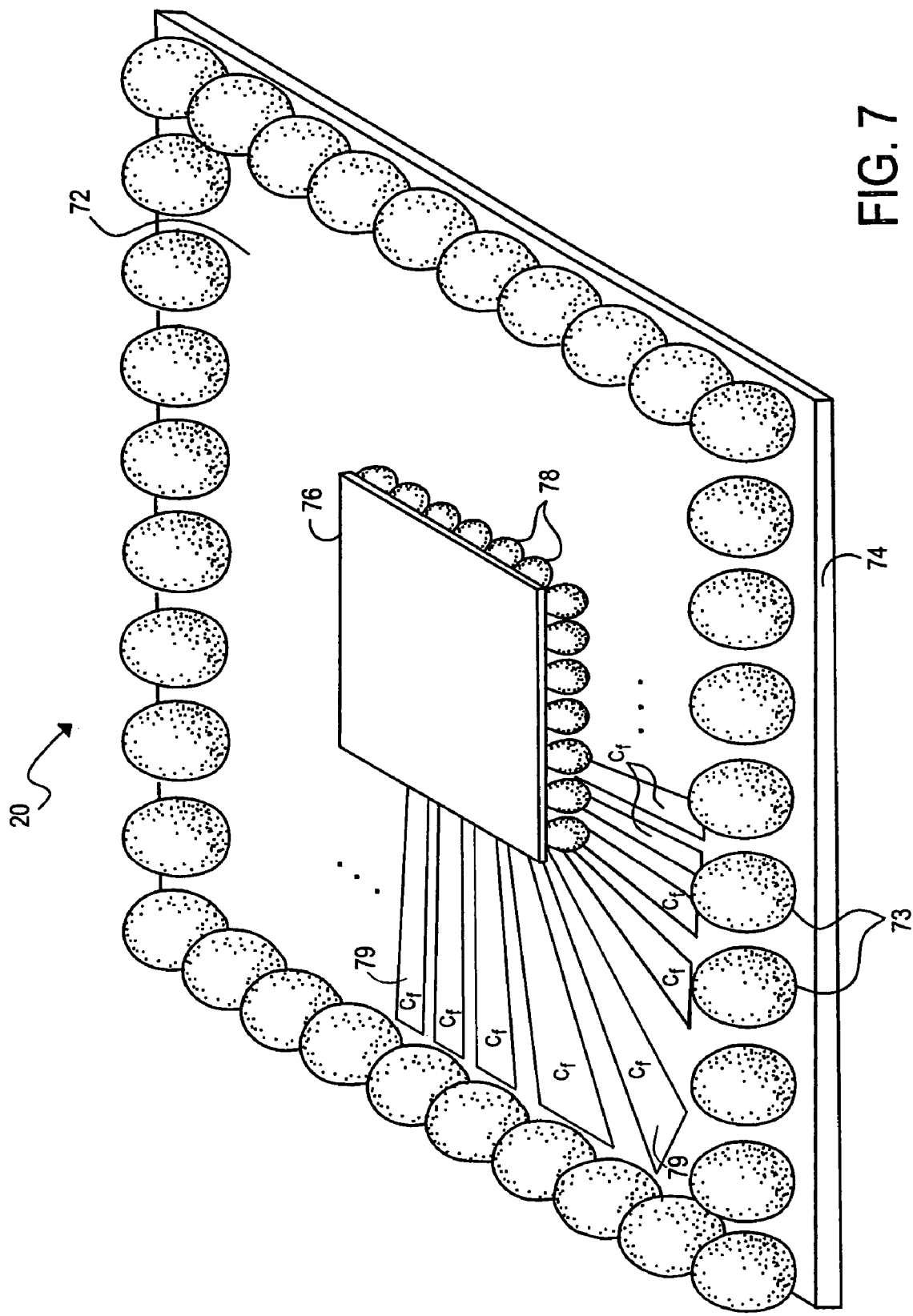
FIG. 7 is a perspective view of one embodiment of the present invention.

FIG. 7 is a perspective view of a preferred embodiment of the present invention. A power module 72 has a substrate 74, on which are formed exemplar thin-film capacitors $C_f$. Capacitors $C_f$ are elongated structures formed with proximal first end portions 77 grouped underneath power management IC 76. The capacitors $C_f$ also exhibit second end portions 79. Capacitors $C_f$ are arranged around a grouping area at an intersection of substrate 74 and power management IC 76. Preferably, power management IC 76 contains control logic 24, drive logic 26, and semiconductor switches needed to operate converter system 20. Further, power management IC 76 is preferably mounted to power module 72 in a flip-chip bare-die arrangement. Capacitor connections 78 connect power management IC 76 to power module 72. Power management IC 76 may, however, be a packaged die that employs ball-grid-array (BGA) leads or other surface connectives.

Figure 8:
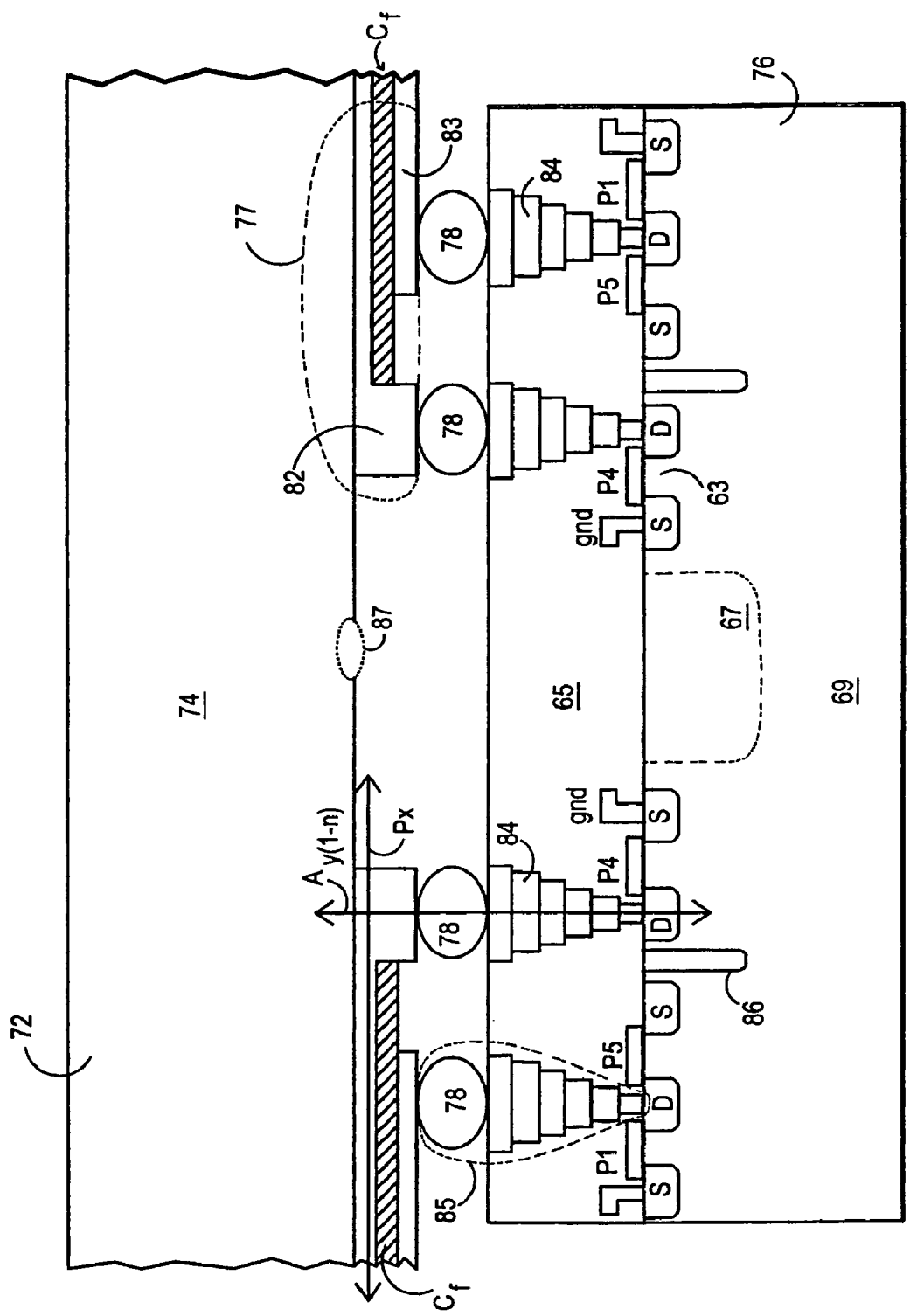
FIG. 8 is a cross-section diagram showing an exemplar configuration of a preferred embodiment of the present invention.

As will be shown further in FIG. 8, each capacitor $C_f$ is arranged in an elongated fashion along a plane while the semiconductor switches of power management IC 76 are arranged to create a minimal length path between the respective semiconductor switches and the electrode access points of the switch-controlled $C_f$ along an axis that is, in this embodiment, perpendicular to the plane of the capacitors $C_f$ arrangement. The circuit topology of the semiconductor switches of power management IC 76 is arranged to match the topology of the respective electrode access points of capacitors $C_f$, allowing, in this embodiment, conductive connections between the semiconductor switches and capacitors $C_f$ that are substantially perpendicular to the plane of substrate 74. In this embodiment, the perpendicular connection scheme reduces the losses and metal migration which typically result from making such connections with PCB traces arranged horizontally with respect to the IC or PCB on which the PCB traces are formed. This embodiment's circuit topology will be described in more detail with regard to FIG. 8. Other embodiments of the invention may include other circuit topology schemes devised to create minimal-length and/or low-loss conductive connections between the semiconductor switches of power management IC 76 and capacitors $C_f$. Such other embodiments may include, for example, a redistribution layer in power management IC 76 and/or substrate 74 to provide partially horizontal conductive paths for some or all of the respective connections. Such a scheme may be devised to, for example, minimize the size of silicon used for power management IC 76 or to provide minimal length connections for alternative layouts of capacitors $C_f$ on power module 72 or alternative layouts for semiconductor switches P1–P5 on power management IC 76. In alternative embodiments, such alternative layouts may include, for example, stacked capacitor structures on power module 72 (described with reference to FIG. 8) or various series (or parallel) multiple-transistor implementations for semiconductor switches P1–P5 (described with reference to FIGS. 18 and 19).

Referring to FIG. 7, power module 72 has solder balls 73 for connection of converter system 20 to its operating environment in a configuration that may be referred to as "direct module attach". Solder balls 73 may also be other types of connection structures such as, for example, pins, wire bonds, bumps, or solder bumps. Preferably, solder balls 73 are arranged about the perimeter of power module 72. Power module 72 is provided with a plurality of circuit paths needed to connect power management IC 76 to its operating environment.

FIG. 8 is a cross-section diagram showing exemplar connections between power management IC 76 and power module 72 in a preferred embodiment of the invention. Its perspective is inverted from that of FIG. 7. Power management IC 76 is shown including substrate 69, controller logic area 67, insulating layer 65, and numerous semiconductor switches such as P4 identified by reference 63. Proximal first end portions 77 of each of two exemplar elongated thin-film capacitors $C_f$ are shown disposed along substrate 74 of power module 72. In other embodiments, there may be stacked capacitors $C_f$ with insulating layers separating capacitors $C_f$ and electrical connections to lower-layer capacitors $C_f$ made in manner devised to present them at the surface of power module 72 in a manner disposed substantially parallel to depicted electrode access sites 82 and 83. Further, in other embodiments, there may be stacked capacitor structures devised in a metal-insulator-metal-insulator-metal configuration in which two capacitors share a common plate operated at ground potential or another fixed or floating potential where such potential may be employed in operation of the circuit. The proximal first end portions 77 include electrode access sites 82 and 83 where capacitor connections 78 between respective capacitors $C_f$ and power management IC 76 are established. In the depicted embodiment, capacitor connections 78 between capacitors $C_f$ and power management IC 76 are implemented with bumps but those of skill will recognize that capacitor connections 78 may be implemented with other suitable techniques including built-up pads or cylinders or solder bumps or other structures of appropriate low behavioral impact. In some embodiments, direct connection between capacitor electrode access sites 82 and 83 and IC connectives 84 may be implemented. Capacitor connections 78 and IC connectives 84 comprise connective structures 85 between respective capacitors $C_f$ and designated semiconductor switches such as semiconductor switches P1, P5, and P4 depicted as being integrated in power management IC 76 in FIG. 8. In a preferred embodiment, power management IC 76 and power module 72 are connected in a die-to-die arrangement. In alternative embodiments, power management IC 76 and power module 72 may be connected by other means, such as, for example, by an interposer having appropriate traces and connections. Preferably, where bumps are employed as capacitor connections 78, the bumps have a low partial inductance such as 50 pH or less, for example. Further, when used as capacitor connections 78, bumps preferably have a low resistance such as, for example, 5 milliohms or less. Preferable bump diameters can range from approximately 200 μm to 50 μm, or smaller. The size of the power management IC 76 die, the number of capacitors $C_f$, and the maximum current passing through each capacitor connection 78 are considerations in choosing bump diameters. Capacitor connections 78, when implemented as bumps are, preferably formed using methods such as, for example, printing, stenciling, and/or plating known in the art.

Capacitor connections 78 are preferably disposed at respective electrode access sites 82 and 83 of capacitors $C_f$ which are located at proximal first end portion 77 of $C_f$. Grouping area 87 is shown in FIG. 8 locating a zone about which respective capacitors $C_f$ are grouped. IC connectives 84 connect capacitors connections 78 to respective terminals of semiconductor switches P1–P5 on power management IC 76. Preferably, IC connectives 84 are implemented as stacked vias but those of skill will recognize that other structures may be employed as IC connectives 84 in the present invention such as, in a non-limiting list of examples, standard foundry interconnects of multiple metal layers and/or vias filled or unfilled as well as direct metal connectives to the switch terminals. Preferably, where implemented as stacked vias, IC connectives 84 are sized to provide coverage of the drain terminal of the respective semiconductor switches (i.e., P1–P5) to which they may be connected. In a preferred embodiment, the floor planning layout of power management IC 76 places the drain of each respective semiconductor switch P1–P5 directly under and substantially along one of axes $A_{y(1-n)}$ for the particular connective structure 85 under consideration whether that structure 85 is composed of capacitor connection 78 and IC connective 84 or just IC connective 84 alone in contact with electrode access sites 82 and 83 for example. In the preferred embodiment, the axes $A_{y(1-n)}$ are substantially normal to the plane Px along which the elongated capacitors $C_f$ are substantially disposed. Consequently, in a preferred embodiment, because the current flows along the connective structure 85, the majority of high current paths between capacitors $C_f$ and IC 76 are normal to the planar orientation of power management IC 76 (and plane $P_x$ along which the elongated capacitors $C_f$ are substantially disposed), thereby inhibiting deleterious metal migration effects.

Semiconductor switches P1, P4, and P5 are shown, but for clarity of view, semiconductor switches P2 and P3 are not shown but are, in a preferred embodiment, arranged in a similar manner with respective IC connectives 84. In this embodiment, a shallow trench isolation (STI) 86 separates switch P4 from switch P5. This is not limiting and other isolation techniques, such as, for example, tub or triple-well isolation or SOI substrates, may be used to improve electrical isolation of semiconductor switches P1–P5. Further, in this embodiment the exemplar semiconductor switches shown are depicted as single transistors but may, in other embodiments, be implemented as multiple transistors combined in series and/or in parallel as described with reference to FIGS. 18 and 19.

Figure 9:
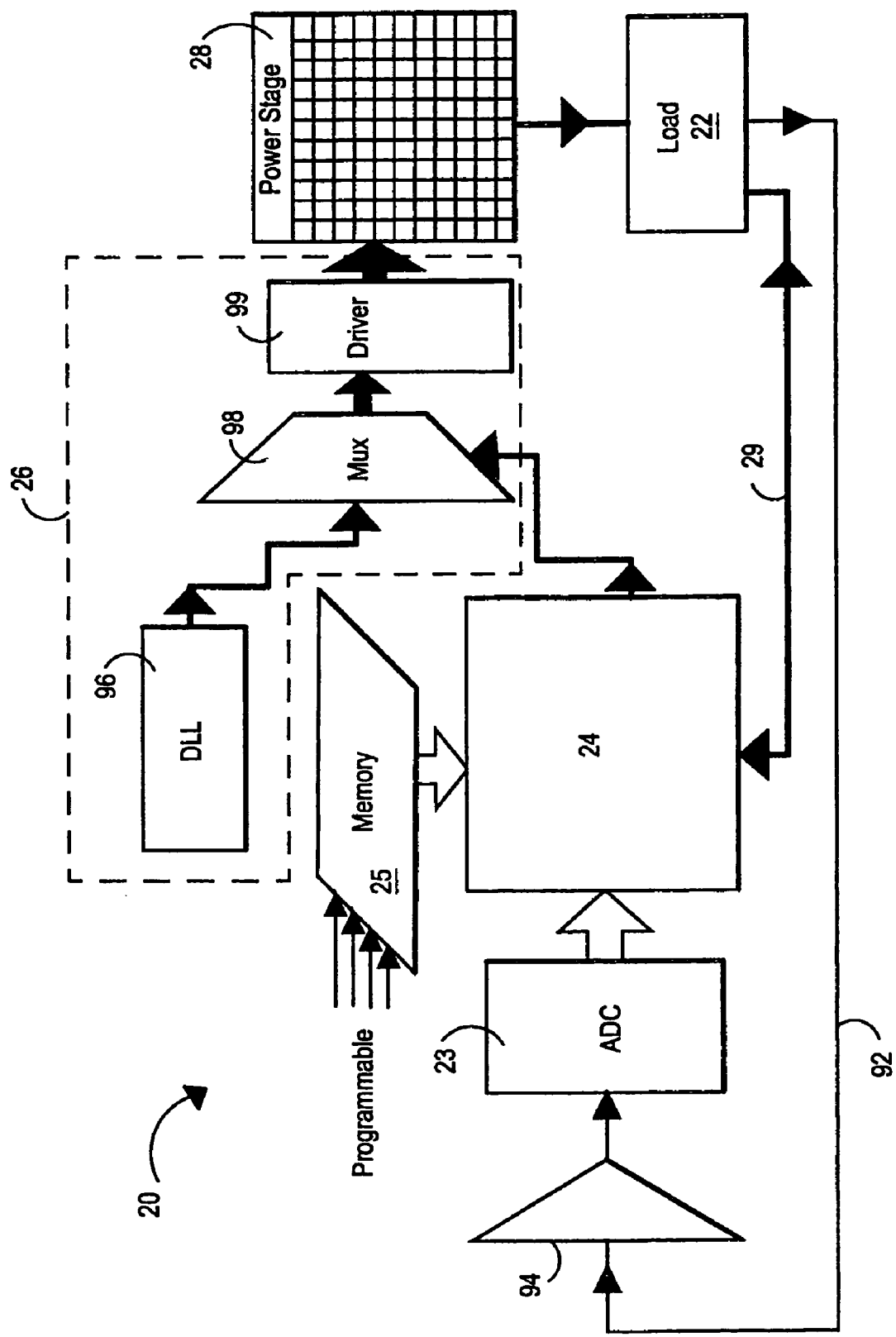
FIG. 9 is a block diagram of another embodiment of the present invention.

FIG. 9 is a block diagram of another embodiment of the present invention. Converter system 20 implements a digital control framework selected to provide implementation of an operating system and related application software through use of an EEPROM 25 with control logic 24. Such EEPROM or other programmable memory may in different embodiments be internal or external to control stage 27. A programmable interface to EEPROM 25 provides the ability to configure and initialize performance parameters such as, for example, multi-tasking to support multiple loads and load characteristics for multiple loads. In other embodiments, EEPROM 25 may be other types of reprogrammable memory. Converter system 20 provides feed-forward control with load-generated commands delivered from load(s) 22 to control logic 24 on instruction bus 29. Control logic 24 may also provide information or responses to load 22 on instruction bus 29. Control logic 24 may be a variety of digital control means such as, for example, a microprocessor, a DSP, a look-up-table (LUT), or a combination of known logic such as combinatorial logic, for example. In a preferred embodiment, during converter system 20 start-up, operation, and shut-down, control logic 24 calculates configuration and operating instructions for power stage 28 using stored and/or real-time data inputs.

Voltage sense signal 92 ($V_{SENSE}$ 92) carries information about the voltage level at load(s) 22. $V_{SENSE}$ 92 may be implemented in many ways such as, for example, a resistive divider network connected to the voltage input(s) of load(s) 22. Conditioning circuitry 94 processes $V_{SENSE}$ 92 through a low pass filter and/or gain amplifier, and applies the processed signal to the input of ADC 23. ADC 23 converts the conditioned $V_{SENSE}$ 92 signal to digital information and transmits it to control logic 24. Control logic 24 computes and transmits state instructions to drive logic 26 and power stage 28.

Drive logic 26 has a phased Delay-Locked-Loop (DLL) 96 that feeds a plurality of time-staggered clock signals to multiplexer 98 which in a preferred embodiment is a MUX tree. Preferably, DLL 96 has a number of outputs equal to the number of phases in power stage 28. DLL 96 may have a clock frequency equal to the desired switching frequency of power stage 28, or DLL 96 may be operated with a multiplied or divided clock frequency devised to provide the desired switching frequency signals on its outputs. The use and design of DLLs are known in the art. Multiplexer tree 98 responds to phase select address signals from control logic 24 and selectively applies output signals from DLL 96 to drivers 99. Drivers 99 apply switching signals to charge and discharge selected phases and blocks in power stage 28. Phases and blocks in power stage 28 supply output current to load(s) 22 as described with regard to FIGS. 3–6 and FIGS. 11–14.

An exemplar embodiment of the invention operates with the parameters listed in Table 1. Those of skill in the art will understand that these parameters and values are merely exemplary and in no way should be construed as limiting. ADC 23 produces, in this example, an 8-bit input to control logic 24 where application software computes 12-bit state instructions for each phase, devised to configure and operate drive logic 26 and power stage 28. An instruction of fewer than 12 bits may be used with a lower granularity in the output voltage control.

TABLE 1

Exemplar Operating Parameters

| | |
|---|---|
| $V_{supply}$: | 12 V |
| Phase $I_{out}$: | 0.5 A per phase |
| Phase Architecture: | 10 capacitor blocks per phase |
| Power Stage: | 30 phases |
| Power Stage $I_{out}$: | 15 A (AC and DC) |
| Loads Serviced/Outputs (p): | 4 with individual voltages ranging from 3.3 V down to 0.5 V |
| $V_{out}$ Granularity: | 11 mV [Selected to accommodate an 8-bit control architecture, this granularity is derived by dividing the output voltage range by $256(2^8)$.] |
| Power Stage Switching Frequency ($f_{sw}$): | 100 MHz |
| Control Stage Sampling: | 100 Mbps |

Power stage 28 in this example has 30 phases, each with its own clock signal to operate respective drivers 94 for its semiconductor switches P1–P5 (not shown in FIG. 9). DLL 96 is configured with a 30-phase output to provide a clock signal for each phase in power stage 28. With a 100 MHz switching frequency (a 10 ns period), DLL 96 staggers its 30 output signals in time steps of 0.3 ns. (10 ns/30 phases=0.3 ns offset for each phase).

Figure 10:
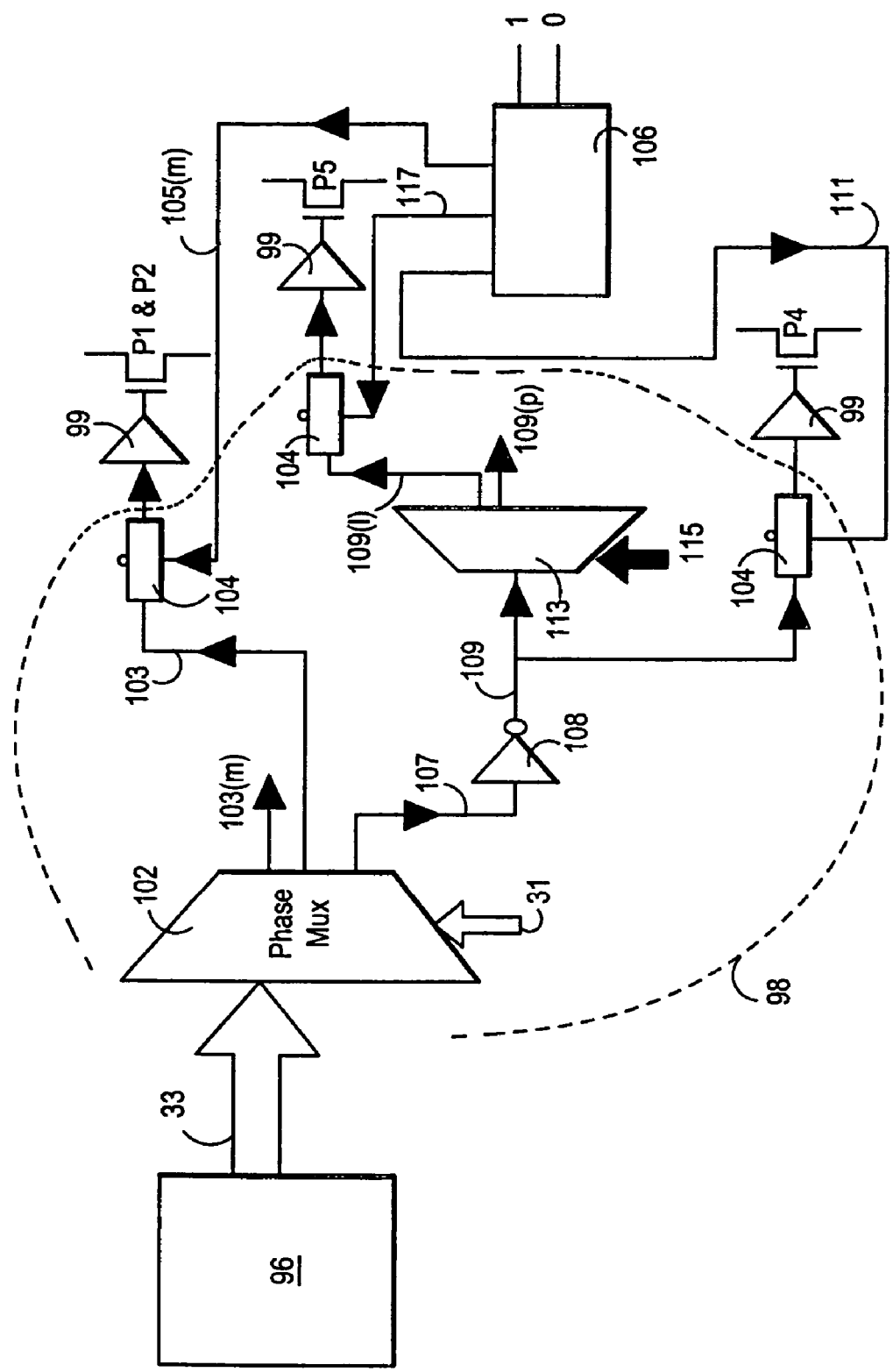
FIG. 10 is a diagram further depicting the exemplar configuration of the embodiment of the present invention of FIG. 9.

FIG. 10 is a diagram continuing the exemplar configuration of the present invention from FIG. 9 and Table 1. FIG. 10 shows one possible implementation of multiplexer tree 98 (FIG. 9) for one phase 32. Phase multiplexer 102 receives a 5-bit phase select signal 31 from control logic 24 (not shown) and selectively applies staggered clock signals 33 from DLL 96 to following phase charge and discharge control circuitry. The right-side portion of FIG. 10 shows circuitry devised to control charging and discharging for only one phase 32. Circuitry for other phases receiving clock signals from phase multiplexer 102 is not shown to simplify the depiction but will be understood with reference to this exposition. Also, those of skill will be able to devise other appropriate control circuitry after appreciation of this specification.

Continuing with reference to the phase charge control circuitry in FIG. 10, phase multiplexer 102 applies a clocked charge signal 103 to a T-gate 104, which also receives an enable signal 105 from capacitor select logic 106. For each active phase 32(*m*), a positive enable signal 105(*m*) from capacitor select logic 106 activates respective T-gates 104 and applies the clock signal to respective drivers 99 for the appropriate P1 and P2 semiconductor switches in the phase. Only one T-gate 104, driver 99 and switch P1 and P2 connection are shown to simplify FIG. 10.

Continuing with reference to the exemplar phase discharge control circuitry depicted in FIG. 10, an inverted clock signal is used to control discharge semiconductor switches P3, P4, and P5 for each respective phase. The clocked discharge signal 107 from phase demultiplexer 102 is inverted by inverter 108 and applied as signal 109 to a T-gate 104. Enablement of this T-gate 104 by signal 111 from capacitor control logic 106 applies the inverted clock signal 109 to respective drivers 99 for the P4 semiconductor switches in the phase. T-gate 104 and driver 99 are reproduced for each P4 switch in the phase. Only one set is shown to simplify the diagram. Signal delay circuitry (not shown) applies the driver 99 signals to respective P3 semiconductor switches in the phase before activation of the P4 and P5 semiconductor switches of the phase, as discussed with regard to FIG. 3. This is also not shown to simplify the diagram.

In this embodiment, inverter 108 also applies inverted clock signal 109 to output demultiplexer 113. For each phase, demultiplexer 113 applies inverted clock signal 109 to selected P5 semiconductor switches of the 'p' loads. An output select signal 115 applied from control logic 24 determines which load P5 semiconductor switches are to be activated. The P5 semiconductor switches may be implemented as discussed above with regard to FIG. 4. Capacitor select logic 106 applies a block enable signal 117 to a T-gate 104, determining which blocks 34 in phase 32 will activate their P5 semiconductor switches for the selected loads.

Capacitor select logic 106 is typical combinatorial logic, well-suited for HDL-based synthesis. In this exemplar configuration, for each of the 10 exemplar capacitor blocks in each phase 32(*m*), capacitor select logic 106 generates enable signals for every switch in the block. That is, enable signals are provided for a single P2 switch for the phase 32 and for 10 blocks 34 each having a P1, P3, P4, and four P5 semiconductor switches, totaling 71 enable signals for each phase 32 in this exemplar configuration. Capacitor select logic 106 activates these enable signals to control how many blocks 34 in the phase 32 will be used.

Figure 11:
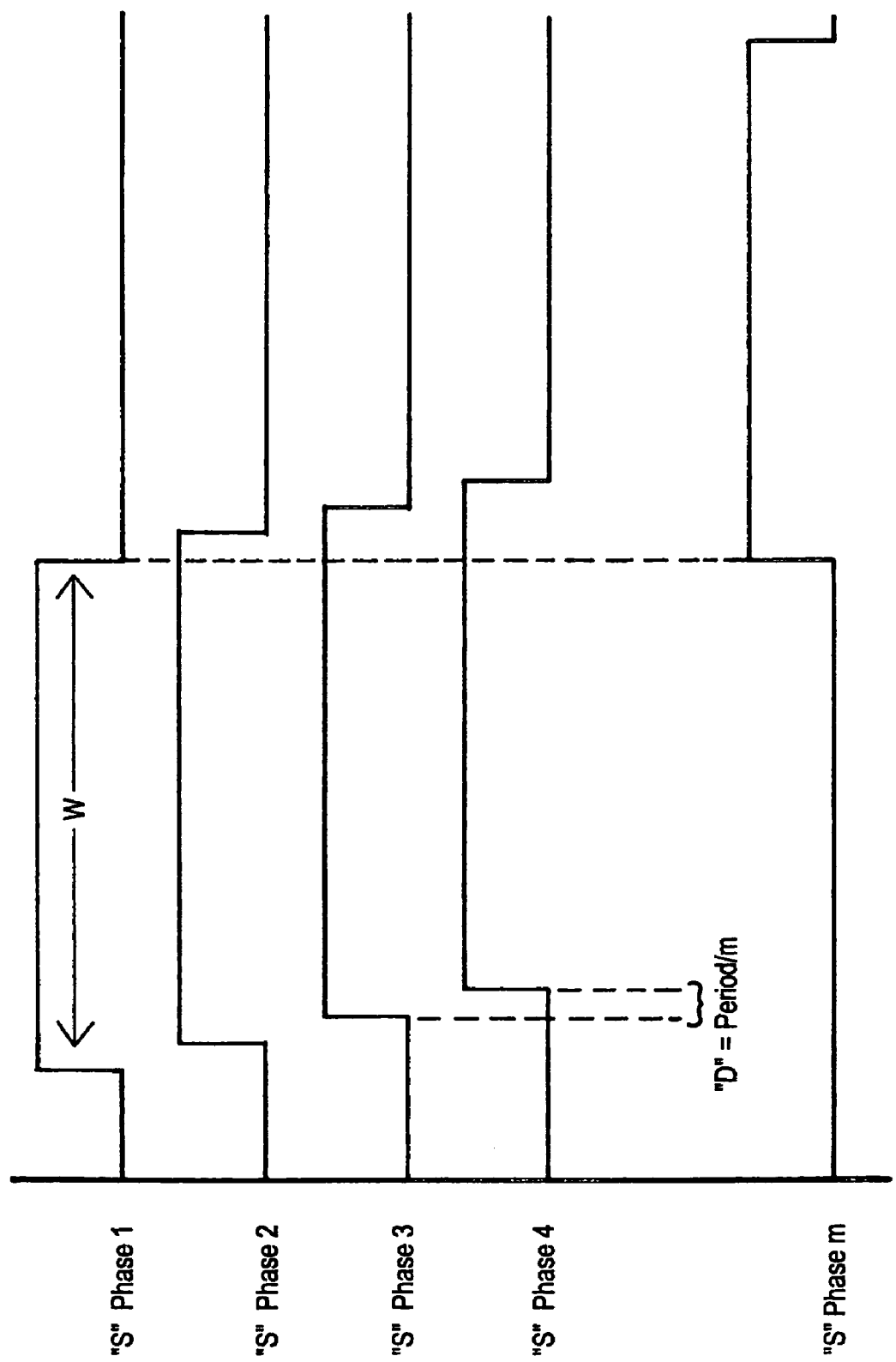
FIG. 11 is a timing diagram of control signals in one embodiment of the present invention.

FIG. 11 is a timing diagram of control signals in one embodiment of the present invention. In this embodiment, power stage 28 has a number of phases "m". The signals "S" shown on the diagram are switch control signals, which are preferably voltage signals. The horizontal axis of the diagram is time. Signals S are applied to P1 and P2 semiconductor switches in each phase in a manner such as, for example, the scheme described above with respect to FIG. 10. The width of a signal pulse, marked as "W", shows the amount of time allocated for each respective phase, 1–m, to charge. In this embodiment, width W is preferably almost one half of the period of the switching frequency at which the power stage is being operated, producing a duty cycle of almost 50% In other embodiments, the duty cycle may vary over a wide range in various manners devised to produce favorable results for operating parameters such as, for example, efficiency, output voltage ripple, number of loads supplied, and others. For example, a stage operated at a 100 MHz switching frequency (a 10 ns period) will preferably have a width W of about 99% of 5 ns. The remaining 1% of time is preferably used as "dead time", before the start of a signal S pulse, in which all semiconductor switches in the phase are deactivated, as discussed above with regard to FIG. 3.

The signals controlling discharging semiconductor switches P3–P5 for each phase are similar to signals S, but will be inverted. Further, switch P3 will preferably be activated slightly ahead of P4 and P5. Preferably, a short "dead time" also exists before any discharging semiconductor switches P3–P5 are activated.

Signals "S" are shown offset from each other in an interleaved or staggered relationship, as introduced above with regard to FIG. 3. The offset or delay is marked "D". Delay D is preferably equal to the period of the switching frequency divided by the number of phases "m".

An interleaved timing diagram is shown as an example, however, signals S may be interleaved with a variety of schemes devised to produce favorable results for operating parameters such as, for example, efficiency, output voltage ripple, number of loads supplied, and others. For example, if more than one load 22 is supplied by a power stage, each load 22 may be allocated a group of phases 32, and each group of phases 32 may be controlled as shown in FIG. 11.

Figure 12:
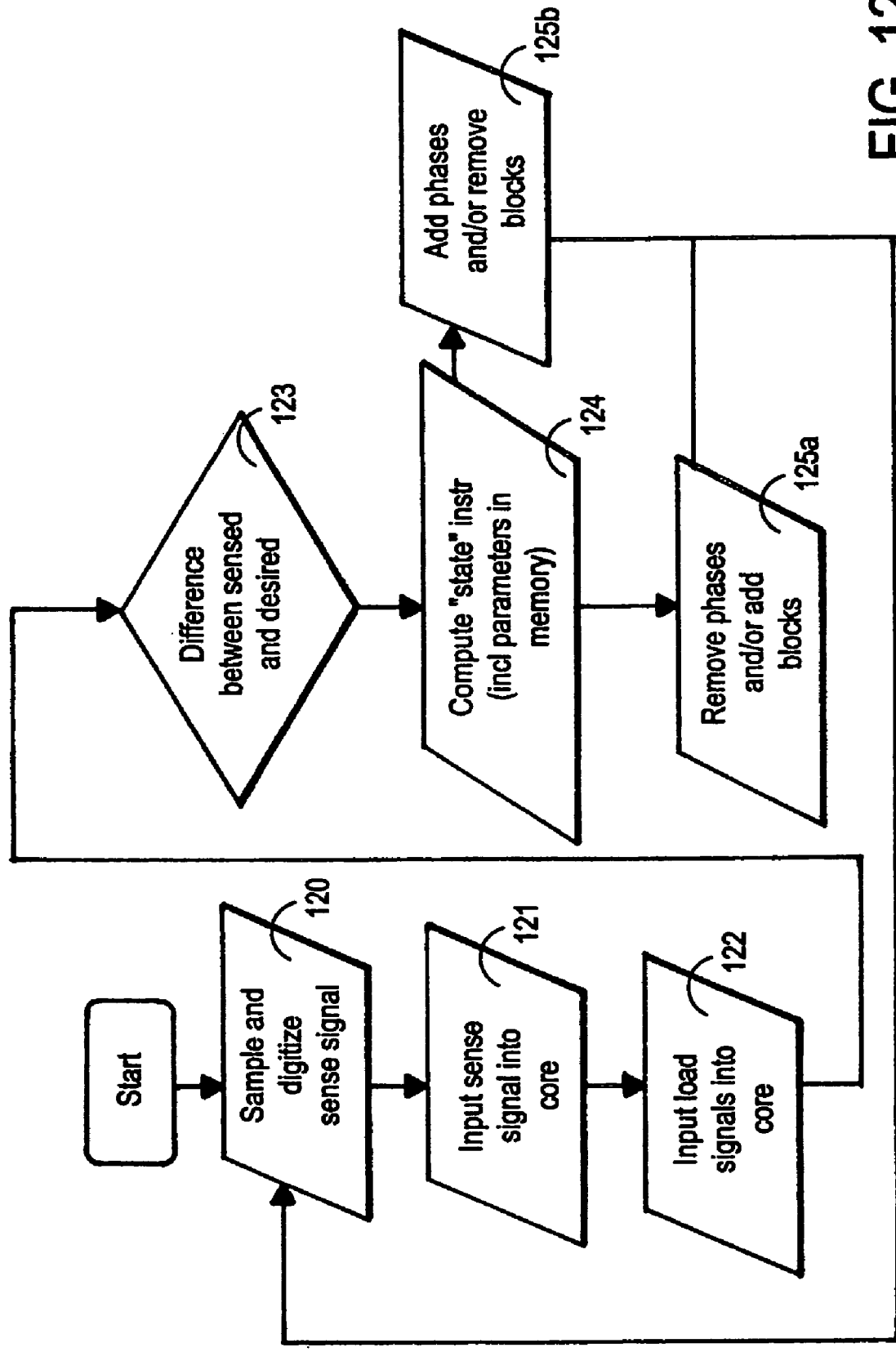
FIG. 12 is a flow chart of a control process for one embodiment of the system of the present invention.

FIG. 12 is a flow chart of a control process for one embodiment of a control stage 27 of the present invention. At the start step, the control stage 27 enters a startup mode devised to control the level of in-rush current and direct it to the uncharged capacitors. In a preferred embodiment, the startup mode is implemented by activating the charging switches (P1 and P2) and saturating a P2 or P1 switch in each phase in a manner devised to limit the current flow to the capacitors $C_f$ until all capacitors $C_f$ in the phase are fully charged.

After the startup sequence is complete, the system enters a control loop which updates the state instructions for the 30 (or m) phases on the output every 10 ns. In step 120 the system samples and digitizes sense signals from the load input voltage. ADC 23 (FIG. 9) samples a voltage level for each load supplied by the system. Using the exemplar values in Table 1, ADC 23 provides an 8-bit sample for each of the four loads every 10 ns.

Step 121 inputs the voltage sense signals into the control logic 24. Step 122 loads feed-forward and feedback control signals from the loads into the processor 24. Step 123 compares the sensed voltage from step 121 and the desired voltage/current from step 122. Step 124 computes and/or looks up a state instruction for each of the phases in power stage 28 (FIG. 9). If less voltage or current is needed, step 125*a* may apply a state instruction to the driver logic 26 (FIG. 9) to remove phases or add blocks to phases supplying the respective load. If more voltage and or current is needed, step 125*b* may apply a state instruction to add phases or remove blocks from phases supplying the respective load. These steps repeat while converter system 20 is in operation.

Those skilled in the art will realize, after appreciating this specification, that a variety of control algorithms or schemes may manage the converter system 20 in accordance with the present invention. As an exemplar control scheme, a look-up-table (LUT) may provide pre-programmed and/or pre-computed state instructions for each desired current and/or voltage level required by the loads. In other embodiments, a LUT may be used as a step in a control algorithm that may combine on-the-fly computed data with pre-computed data. Further, a variety of computational algorithms may provide pre-computed and/or on-the-fly computations devised to provide state data and/or aid selection of desired operating states.

FIG. 13 depicts another alternative embodiment of a power stage 28 according to the present invention. As an alternative to organizing the capacitors $C_f$ into an array of "m" phases, each comprising "n" blocks, power stage 28 is configured as a single "cascode" phase comprising a large number "n" of capacitor blocks 34. For example, as an alternative to 100 capacitor blocks arranged as 10 phases, each comprising 10 blocks, the power stage 28 may be designed as 1 phase comprising 100 blocks 34. In contrast to embodiments described with regard to FIGS. 3–5, this alternative embodiment may more directly use all blocks 34 to satisfy load/line requirements. Further, this alternative embodiment may provide more immediate response to abnormal power conditions which may arise.

Power stage 28 depicted in FIG. 13 adds a plurality of P2 semiconductor switches identified by reference 132. The locations and number of P2 semiconductor switches 132 depend on the desired level of granularity for dynamic reconfiguration. A P2 switch 132 connected to every block 34 provides the highest level of granularity for reconfiguration.

Figure 14:
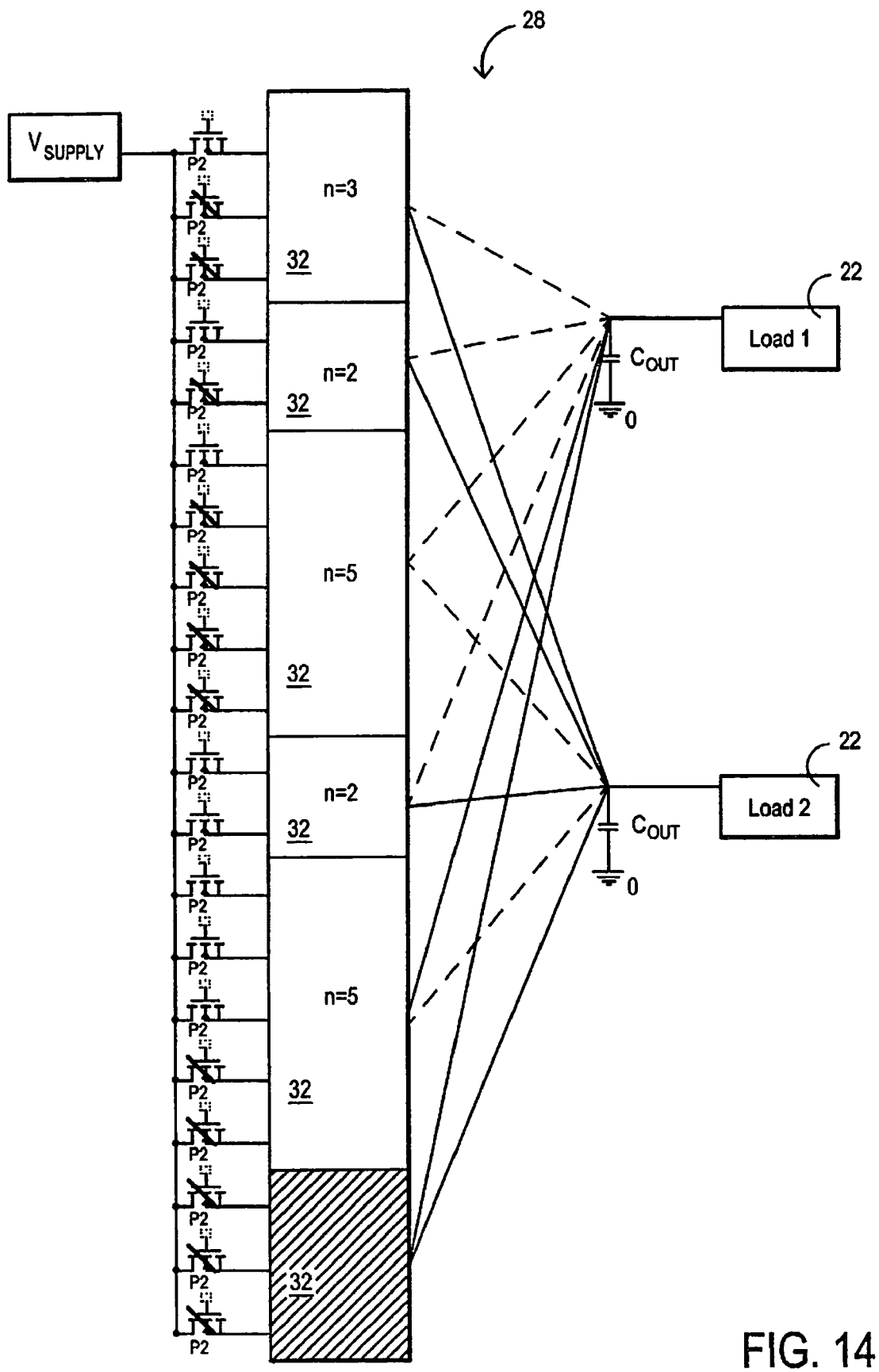
FIG. 14 further depicts further exemplar features of an embodiment of the power stage of FIG. 13.

FIG. 14 depicts an embodiment of a power stage 28, as introduced with regard to FIG. 13, which in this Figure is depicted as supplying two loads 22. Power stage 28 is configured based on application initialization of control stage 27 (not shown in this Figure) and operating conditions of loads 22. Five of the depicted semiconductor switches P2 are enabled, dividing power stage 28 into 5 active phases 32, respectively labeled with the number "n" of blocks in each phase 32, and one uncharged phase 32, (diagonal lines) near the bottom of FIG. 14. Semiconductor switches P1, P3, P4, and P5 are not shown in each phase to simplify the diagram.

The disabled P2 semiconductor switches are marked as crossed out with a single diagonal line. In this embodiment, the disabled P2 semiconductor switches do not activate during the charging cycle for the respective phases 32. Solid lines show enabled connections to loads 22 from phases 32, and dashed lines show disabled connections to loads 22. The connections are preferably implemented by operating semiconductor switches P5 (not shown in this Figure) as described with regard to FIG. 4. The phase 32 shown with a dashed line to both loads 22 is kept in a charged state ready to be connected to either load to ramp-up power to the load. The uncharged phase 32 shown with solid lines connected to both loads 22 is, in the depicted state, devised to cause a ramp-down in power to loads 22.

Figure 15:
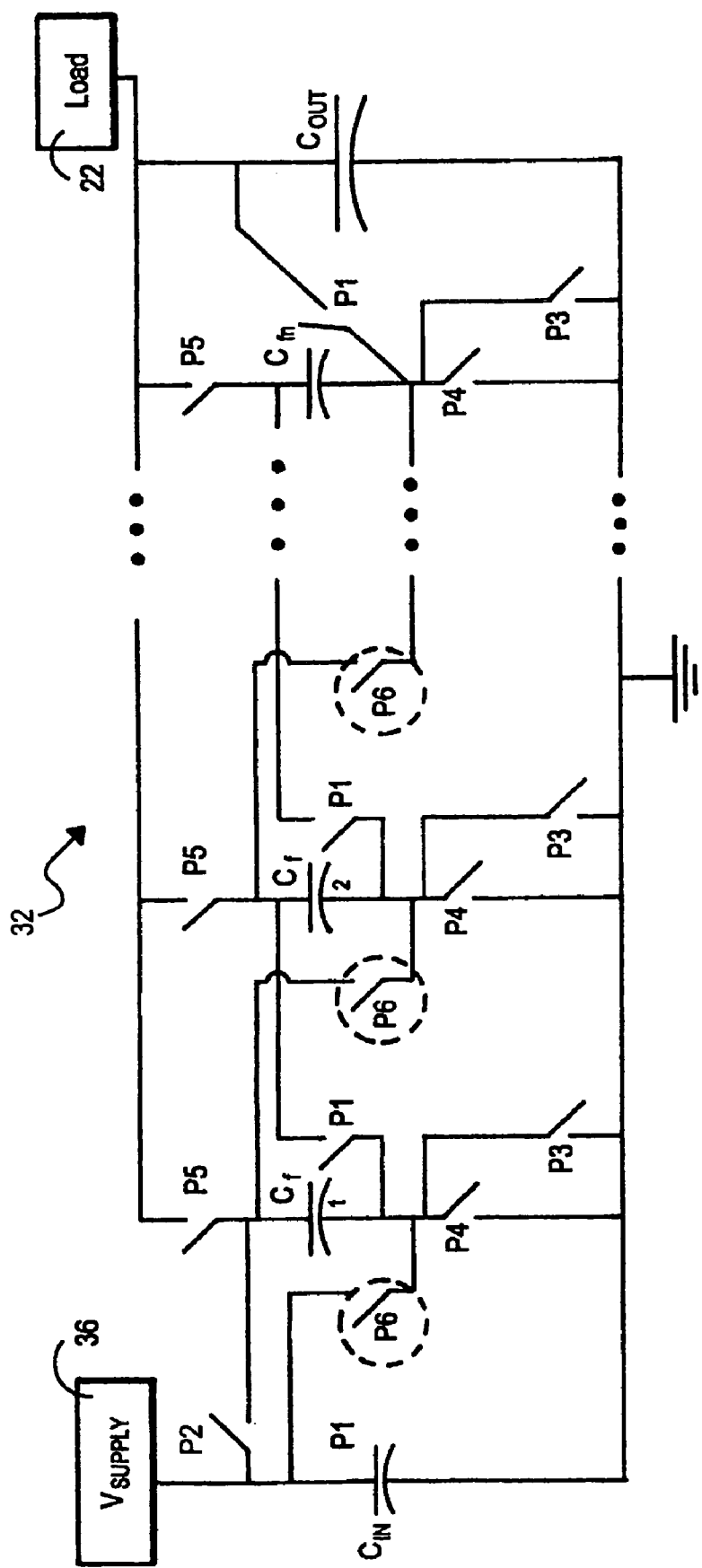
FIG. 15 is a process flow chart for fabricating a power module with thin-film capacitors according to a preferred embodiment of the present invention.

FIG. 15 depicts a phase of capacitors with voltage boost capability according to yet another embodiment of the present invention. The phase 32 of the depicted embodiment is similar in design to embodiment of phase 32 depicted in FIG. 3, with the addition of a P6 semiconductor switch connecting the positive terminal of capacitor $C_{IN}$ to the negative terminal of the capacitor $C_f$ in the block 34 proximal to voltage supply 36 and additional P6 semiconductor switches connecting the positive terminal of the remaining capacitors $C_f$ to the negative terminal of the capacitor $C_f$ in the next proximal block. The additional P6 semiconductor switches are circled with dashed lines in FIG. 15 to point out their locations. Such additional P6 semiconductor switches enable phase 32 to be employed for step-up (or "boost") voltage conversion. In contrast to step-down operation in which capacitors $C_f$ are typically charged in series and then discharged in parallel, during step-up operation capacitors $C_f$ are charged in parallel by activating semiconductor switches P2, P5, P3, and P4, followed by discharging in series by activating semiconductor switches P6 and the semiconductor switch P5 in block 34 proximal to load 22. In operation, embodiment of phase 32 depicted in FIG. 15 may be configured or re-configured dynamically to provide a voltage to load 22 that is higher than that of voltage supply 36. For example, in a phase 32 comprising 8 blocks 34, the output voltage when operated in step-up configuration as described herein may be as high as approximately 9 times the input voltage. Further, intermediate output voltages may be obtained by operating selected P6, P5, P4, and P3 semiconductor switches during the discharge stage of operation. In this embodiment, the boost-buck topology may be beneficial in battery powered applications where the battery-provided input voltage may be above or below the load's required voltage depending on the battery's discharge state. In response to these dynamic conditions, a converter 20 having phase(s) 32 according to the depicted embodiment may dynamically implement changes in it operating mode—shifting from buck to boost (and back to buck, etc) as required by dynamic battery and load conditions. Further, in other places in this specification where semiconductor switches P1–P5 are described or characterized, such description or characterization may also include switches P6 where alternative embodiments may employ switches P6.

Figure 16:
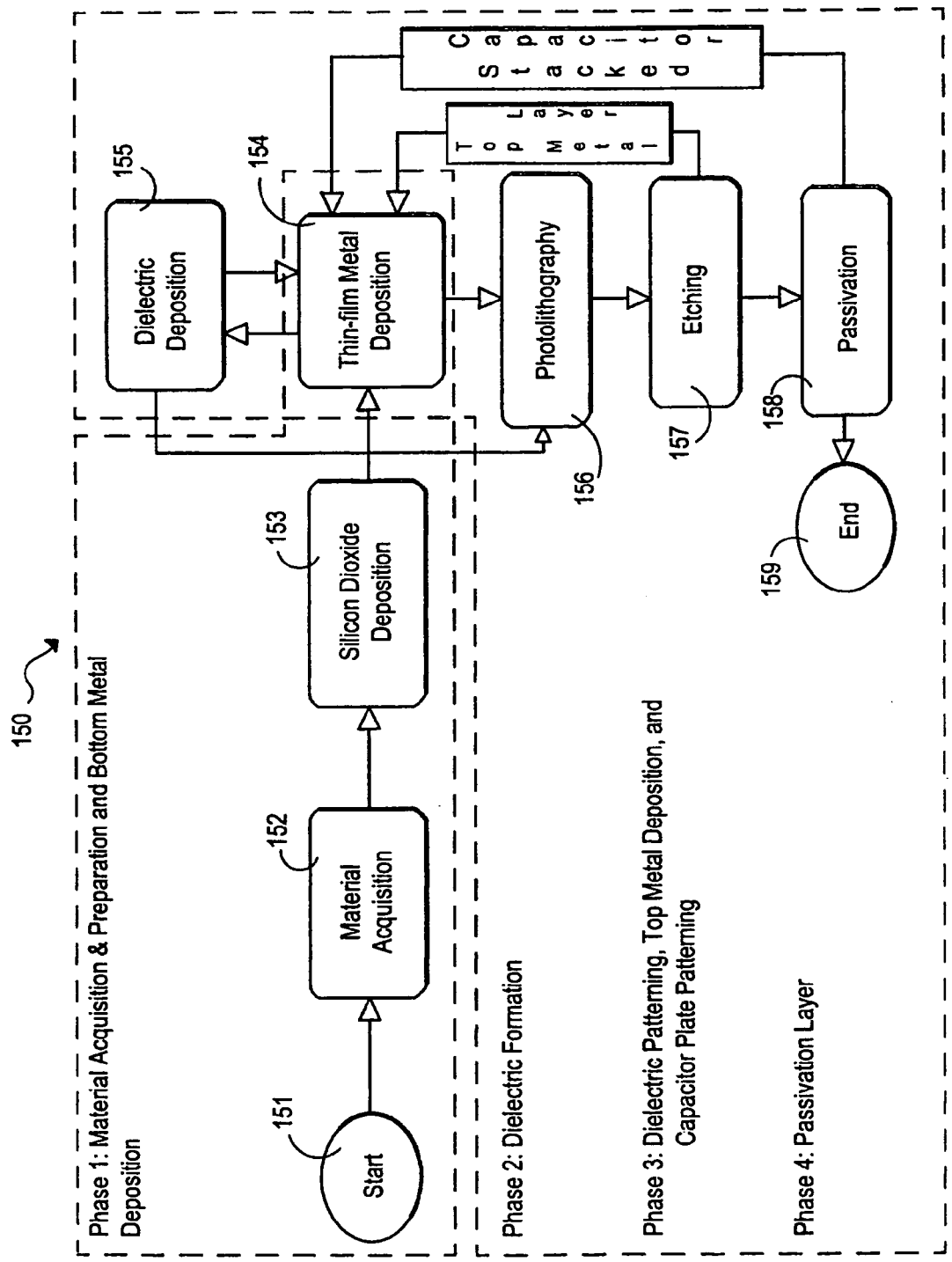
FIG. 16 is a chart of example process steps and sub-steps for fabricating thin-film capacitors according to a preferred embodiment of the present invention.

FIG. 16 is a process flow chart for fabricating thin-film capacitors or a power module with thin-film capacitors according to a preferred embodiment of the present invention. Process steps 151–159 are further detailed in the exemplar sub-steps shown in FIG. 17, which also contains exemplar parameters that may be employed.

According to a preferred embodiment of the present invention, process 150 contains four Phases. Phase 1: Substrate Preparation and Bottom Metal Deposition starts with step 151 and proceeds to step 152 in which a silicon substrate is prepared. In a present preferred embodiment, the silicon substrate is prepared using an eight-inch or six-inch silicon wafer in a clean room. In alternative embodiments, the silicon substrate may be replaced with other substrates, such as, for example, glass, polyimides, ceramic, FR4, and metallic foils. Material chosen for use as a substrate preferably has a coefficient of thermal expansion (CTE) similar to that of power management IC 76 (FIG. 8). Such similarity of CTEs may enhance the characteristics of the preferred die-to-die connection described with regard to above-referenced FIG. 8.

Continuing with reference to Phase 1 of process 150, step 153 preferably deposits a silicon oxide thin film on the silicon substrate. In a preferred embodiment, step 153 deposits silicon dioxide on the silicon wafer in a thin layer devised to prevent leakage from the capacitor and facilitate adhesion for the bottom metal layer deposition in step 154. The silicon dioxide is preferably deposited using a chemical vapor deposition (CVD) process which mixes chemicals together in gaseous or vapor phase to facilitate reaction. An alternative deposition process is thermal oxidation performed in a hot furnace. Both CVD and thermal oxidation are well known in the art.

Step 154 of Phase 1 deposits thin film metal, devised to serve as a bottom electrode of the thin film capacitors, and deposits an initial dielectric seed layer. These metal layers are preferably deposited using physical vapor deposition processes such as, for example, sputtering. In a preferred embodiment, a titanium layer approximately 200–500 angstroms thick is deposited on top of the silicon dioxide layer. The titanium layer is devised as an adhesion layer for the copper metal layer serving as the capacitor's bottom electrode.

Continuing with regard to Phase 1, step 154 deposits a copper layer to serve as a bottom electrode of the respective capacitor using, preferably, a sputtering process. In alternative embodiments, step 154 may instead deposit metals such as aluminum, silver, or gold, for example. The copper or other metal layer thickness of the top and bottom electrodes may be determined by the targeted equivalent series resistance of the capacitor. As an exemplar, a one-micron copper layer typically provides an ESR of approximately 17 milliohms/mm$^2$. Step 154 deposits an optional dielectric seed layer on top of the previously deposited bottom electrode copper layer. In a preferred embodiment, a tantalum layer is deposited, the layer being sufficiently thick to support the preferred dielectric formation discussed below with regard to step 155.

Phase 2: Dielectric Formation may be achieved using a variety of techniques some of which are, for example, sputtering, CVD, MOCVD, spin-on polymers, electrochemical processes, sol-gel, laser ablation, and ferroelectric powders dispensed in epoxy. In a preferred embodiment, step 155 deposits a layer of tantalum oxide. In other embodiments, the dielectric layer may be other dielectric materials such as, for example, titanium oxide, aluminum oxide, hafnium oxide, barium titantate, silicon dioxide, silicon nitride, yttrium oxide, germanium oxide, and other materials known in the art. The dielectric formation procedure will depend on the dielectric used. Preferably, pure tantalum is anodized to form the capacitor's dielectric, tantalum oxide. Those of skill in the art will recognize anodization as a well-characterized procedure thoroughly described in literature.

Although anodization processes are preferred, in other embodiments, other procedures such as, for example, PVD and CVD methods, may be used when depositing dielectric materials. These other procedures and materials may offer higher dielectric constants and higher yields.

FIG. 17 is a chart that recites exemplar steps in a preferred method for fabricating a power module in accordance with one embodiment of the invention. Those of skill will recognize that these are just example steps in an exemplar method and the creation of a power module in accord with the present invention may be implemented in a variety of ways with a variety of methods that may include some of the specifics shown in FIG. 17. Referring again to FIG. 16 and FIG. 17, in Phase 3, a dielectric patterning procedure is devised to form individual capacitor dielectrics out of the dielectric layer deposited in Phase 2. Step 156 of Phase 3 applies photo-resist in a pattern devised to achieve the target capacitor layout of the power module being fabricated. Step 156 exposes and develops photo-resist according to conventional photolithography processes. Step 157 etches the dielectric layer and dielectric seed layer. In a preferred embodiment, wet etching is employed to etch the seed tantalum layer and the dielectric tantalum oxide layer. Those of skill in the art will understand the etchants required to etch these materials. In one alternative embodiment, dry etching processes, such as reactive ion etching (RIE) or ion milling, may be used to etch the tantalum and tantalum oxide.

Continuing with reference to Phase 3 in FIG. 16 and FIG. 17, after dielectric patterning in steps 156 and 157, step 154 deposits the top metal layer of the capacitors to form the top electrode of the capacitor and the capacitor contacts. Preferably, step 154 deposits a titanium layer and a copper layer as discussed above with regard to the first occurrence of step 154. In a preferred embodiment, steps 154, 156, and 157 are repeated to define and form contacts for top and bottom electrodes.

Referring to Phase 4 depicted in FIG. 16 and FIG. 17, step 158 deposits a passivation layer devised to protect top capacitor electrodes from corrosion, oxidation, etc. and to define areas for bond pads. Preferably, the passivation layer is applied using standard IC spin-on polymer materials such as, for example, benzocyclobutene, or BCB. Depending on the bumping process employed to connect the power module to the power IC, additional steps may be performed to prepare the bond pad areas.

Figure 18:
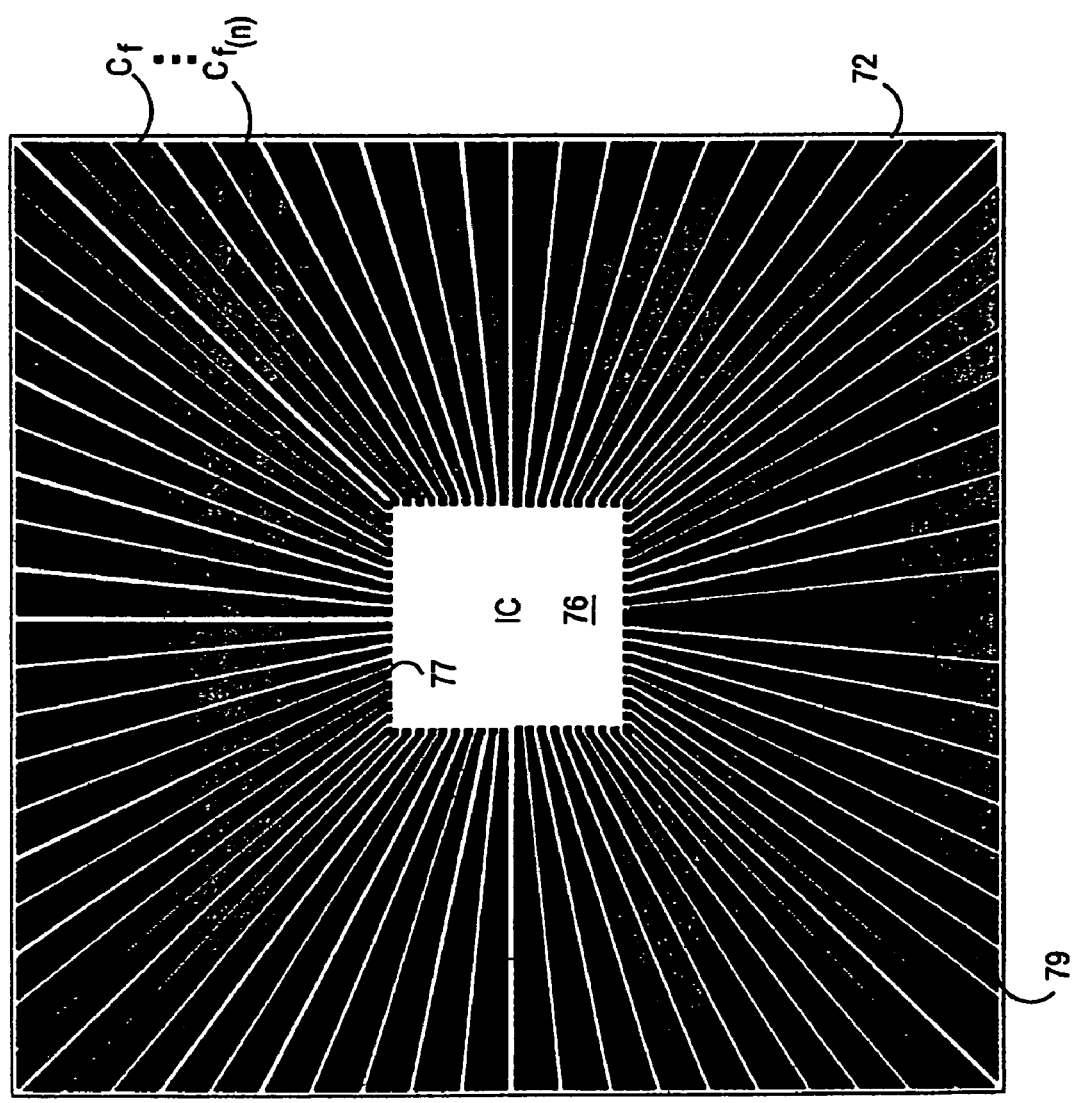
FIG. 18 depicts a layout of capacitors on a power module according to one embodiment of the present invention.

FIG. 18 depicts a layout of capacitors on a power module according to one embodiment of the present invention. The capacitors $C_f$ are disposed in an arcuate arrangement about a grouping area that lies in the area of intersection of power management IC 76 and power module 72. Power management IC 76 is placed above the proximal first ends 77 of the plurality of thin-film capacitor $C_f$.

Figures 19, 20:
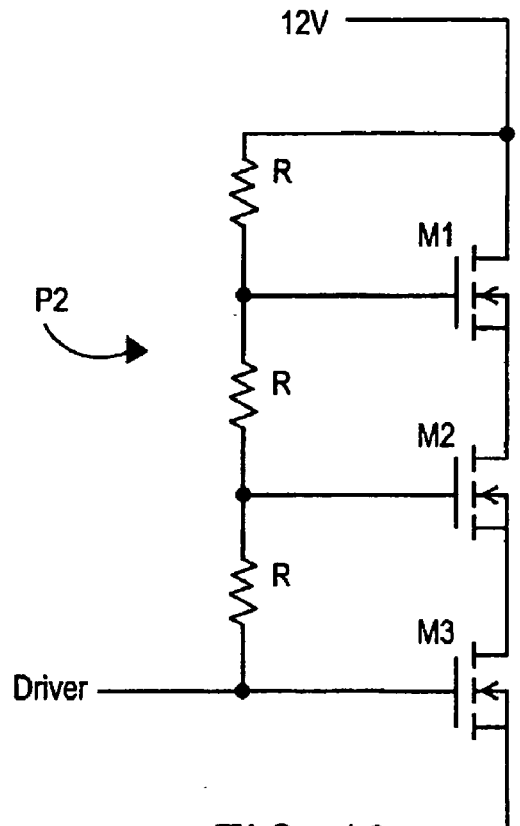
FIG. 19 depicts an implementation of a switch according to an embodiment of the present invention.
FIG. 20 is a table of exemplar characteristics that may be employed to practice preferred embodiments of the present invention.

FIG. 19 depicts an implementation of switch P2 of FIGS. 3, 5, and 6 according to an alternative embodiment of the present invention. In this embodiment, switch P2 is formed by "stacking" a series of individual transistors M1, M2, and M3 devised to raise the breakdown voltage ($BV_{DSS}$) of each switch sufficiently to meet the typical operating requirements that may be encountered in many embodiments of the invention. Such an embodiment may be employed with a suitable driver or drivers in a configuration devised to minimize switching losses and achieve a desired switching frequency $F_{SW}$. Further, where description or characterization of switches P1–P5 is made in this specification, those of skill will understand after appreciating this specification that semiconductor switch P6 may also be characterized by such description in alternative embodiments such as the exemplar embodiment in FIG. 19.

FIG. 20 is a table of exemplar characteristics that may be employed to practice preferred embodiments of the present invention. The ranges of parameters listed in FIG. 20 are in no way limiting to the various possible embodiments of the invention and merely represent presently preferred embodiments. As those of skill in the art will realize after appreciating this specification, the present invention may be practiced with values well outside those in FIG. 20 or with different combinations of values within the ranges in FIG. 20.

Figure 21:
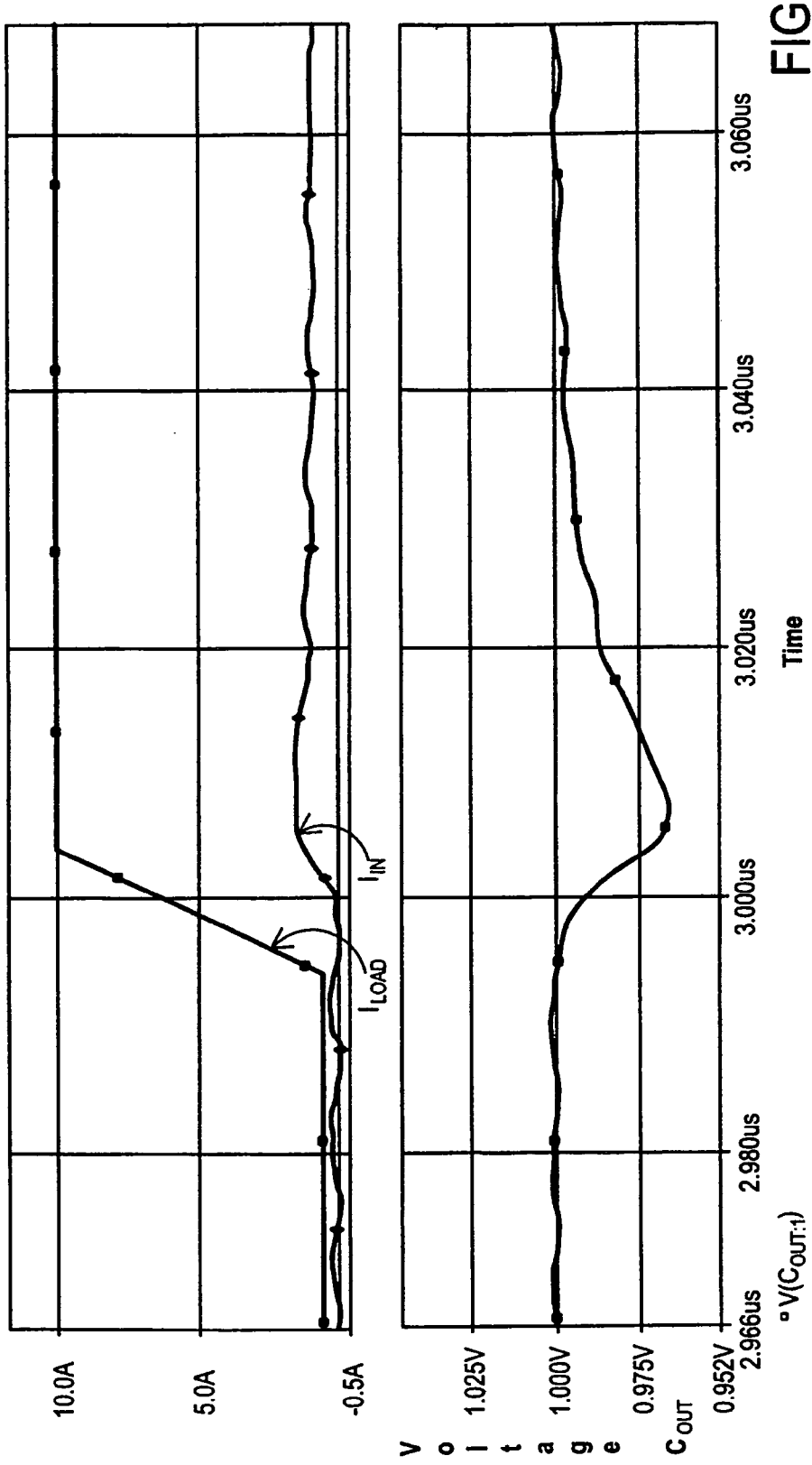
FIG. 21 depicts modeled input and output characteristics of one embodiment of the present invention.

FIG. 21 depicts modeled input and output characteristics of one embodiment of the present invention. This embodiment produces transient up response (and a similar transient down response) of approximately one amp per nano-second.

FIGS. 22–29 depict how certain embodiments of the invention may be employed to modulate output impedance in a manner that may be independent of the system switching frequency. Such impedance modulation may be referred to as "digital impedance modulation" (DIM).

Figure 22:
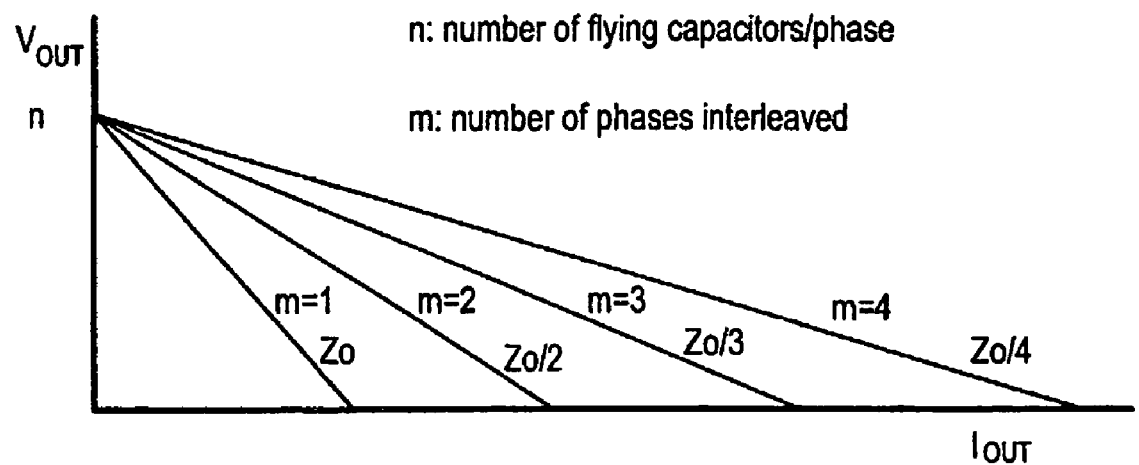
FIG. 22 depicts output impedance characteristics according to an embodiment of the present invention.

FIG. 22 depicts output impedance characteristics according to an embodiment of the present invention. For a number 'n' of capacitors $C_f$ in a phase 32, each descending line in FIG. 22 represents the output impedance Z of a specified number 'm' of phases 32 combined in parallel and interleaved as described with regard to above referenced FIGS. 5–6 and FIGS. 11–14. Output impedance Z is expressed by equation 1, where $\Delta V_{OUT}$ is an incremental change in the output voltage and $\Delta I_{OUT}$ is a corresponding incremental change in the output current.

$$Z = \Delta V_{OUT}/\Delta I_{OUT} \quad (1)$$

Referring still to FIG. 22, the steepest line (m=1) represents the impedance of a single phase 32 and successively shallower lines representing progressively more phases 32 being connected in parallel, which typically provides lower output impedance. The impedance of a particular phase may be increased by employing smaller switches and smaller capacitors $C_f$.

Figure 23:
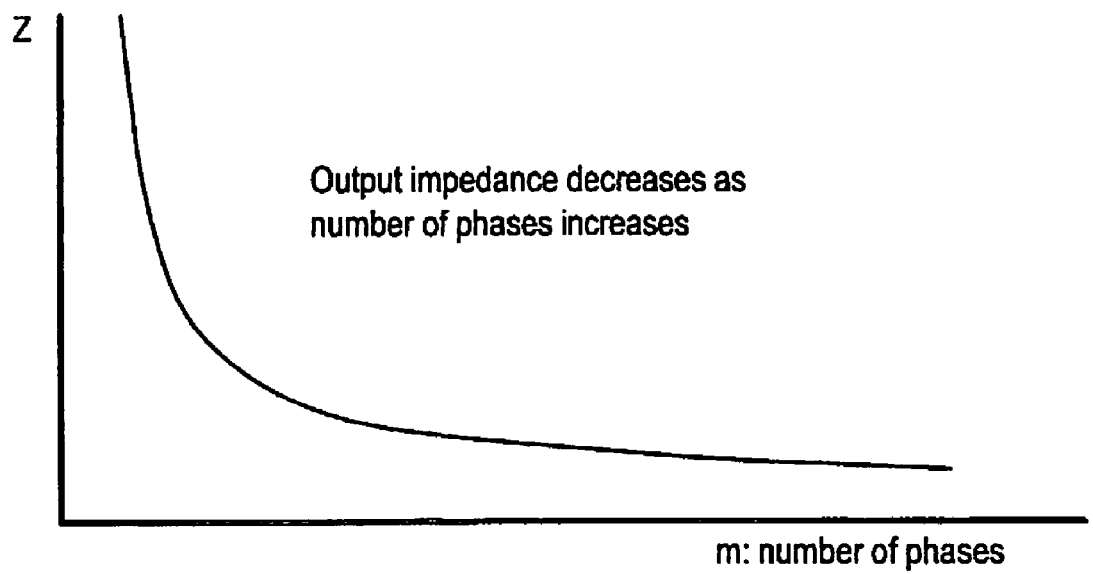
FIG. 23 depicts output impedance versus number of phases according to an embodiment of the present invention.

FIG. 23 depicts output impedance versus number of phases according to an embodiment of the present invention. Output impedance Z typically decreases in a manner proportional to 1/m as the number 'm' of phases 32 increases.

Figure 24:
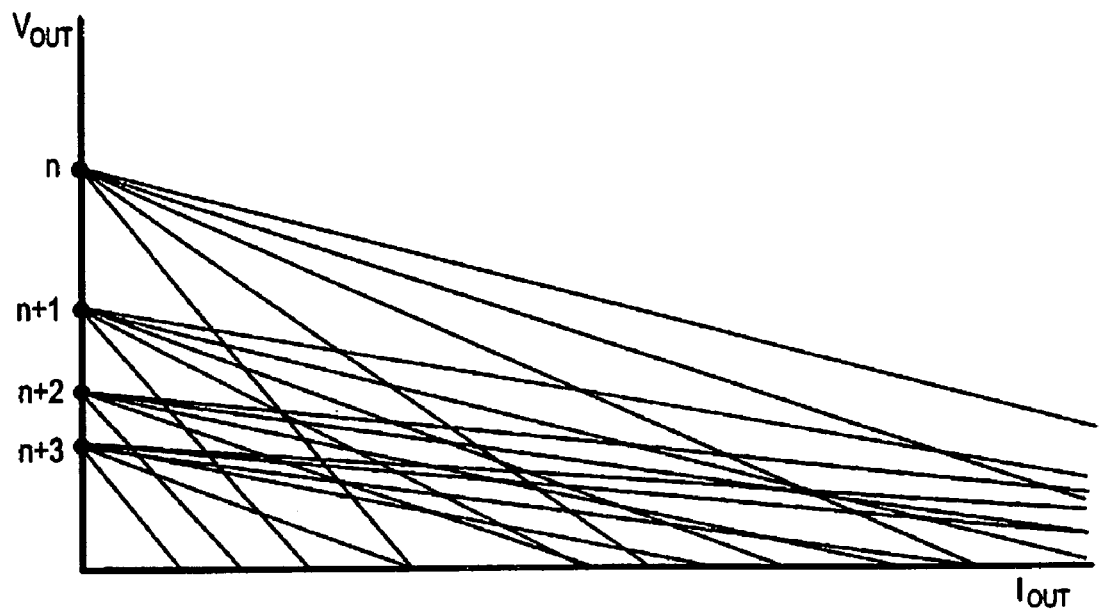
FIG. 24 depicts output impedance characteristics according to an embodiment of the present invention.

FIG. 24 depicts output impedance characteristics according to an embodiment of the present invention. Output impedance Z, described with regard to FIG. 22, is depicted by impedance lines. A set of impedance lines is shown for an embodiment operated with alternative numbers 'n' of capacitors $C_f$. Number 'n' may be adjusted as described with regard to above-referenced FIGS. 5–6 and FIGS. 12–13. In this embodiment, the impedance lines depicted in FIG. 24 represent converter 20's fixed set of output combinations of voltage and current. Combinations which are not represented by a point on an impedance line are not, in this embodiment, deliverable by converter 20 to the exemplar load 22 (not shown in this Figure). Accordingly, in applications where there is a need to maximize load customization and regulation, a relatively larger numbers 'n' of capacitors $C_f$ in each phase and relatively larger numbers 'm' of phases 32 may be needed. Such larger numbers 'n' and 'm' are devised to enhance converter 20's output granularity and efficiency while substantially reducing input and output ripple.

Figure 25:
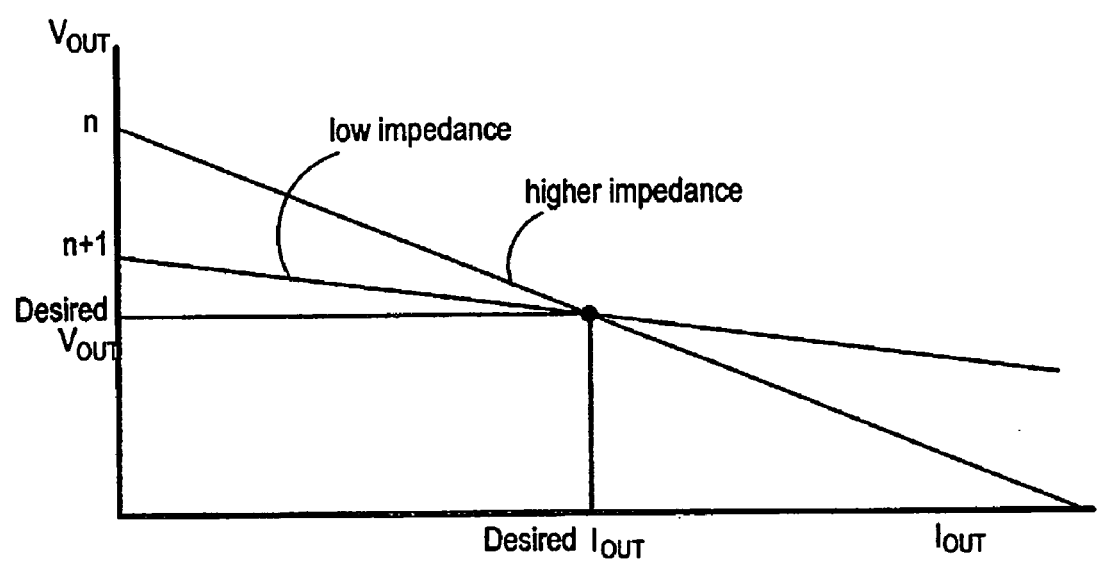
FIG. 25 depicts an example operating point of one embodiment of the present invention.

FIG. 25 depicts a desired operating point of one embodiment of the invention. Converter 20 may achieve higher efficiencies and lower input/output ripples when operating on a shallower available impedance line for a given value of 'n'. A shallower slope represents lower impedance, which typically delivers higher efficiency. For example, assume a particular load 22 requires a specific combination of $V_{OUT}$ and $I_{OUT}$, and converter 20 can meet this output condition using either n capacitors $C_f$ or n+1 capacitors $C_f$. In this exemplar case, the desired output condition occurs at the intersection of two impedance lines, as shown in FIG. 25. In such a case, control stage 27's control algorithms may select the n+1 impedance line in order to achieve the higher efficiency when compared to operating on the n impedance line. In the event, however, that converter 20 needs to supply multiple loads which may require high currents or a high dynamic range of current, the controller may select and implement the n impedance line. Such selection is devised to reserve capacitors $C_f$ for re-allocation to other loads if required.

Figure 26:
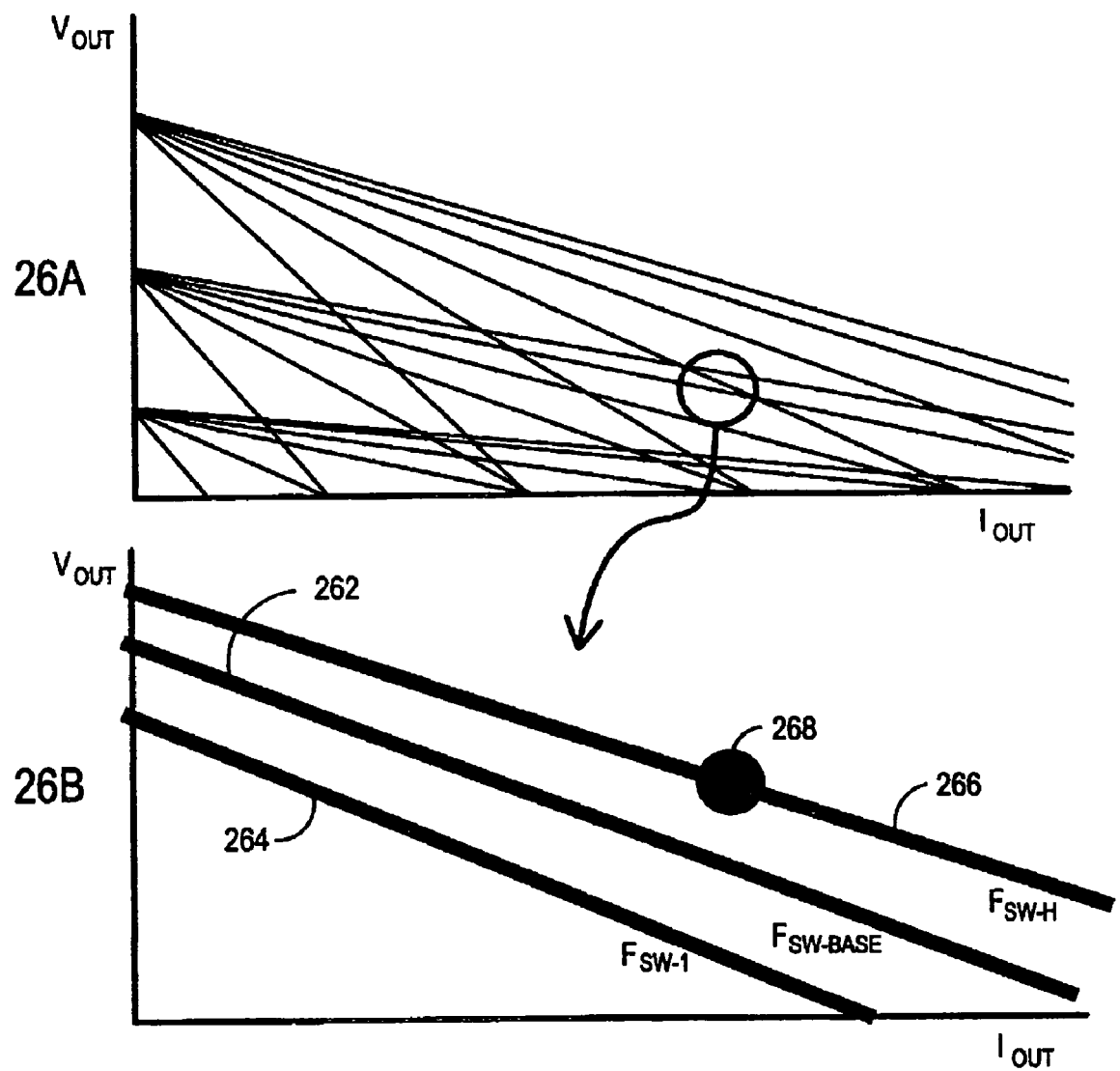
FIG. 26 depicts further output impedance characteristics according to an embodiment of the present invention.

FIG. 26 depicts further output impedance characteristics according to an embodiment of the present invention. Graph 26A shows impedance lines characterizing an embodiment of the present invention similar to that described with regard to above-referenced FIG. 24. In this embodiment, the Graph 26A impedance lines depict three values of 'n' each having six values of 'm'. This embodiment and other embodiments are not, however, limited to particular values for numbers 'n' and 'm' and may employ and configure smaller or much larger numbers of capacitors $C_f$ and phases 32. Graph 26B depicts an enlarged view of one impedance line 262 with alternate versions of line 262 shown as lines 264 and 266. (Lines 264 and 266 are not shown in graph 26A.) Alternative lines 264 and 266 may be achieved by changing the switching frequency $F_{SW}$ for the phases 32 which are characterized by impedance line 262. The granularity of converter 20's digital impedance modulation (DIM) control process may be improved by implementing changes in the switching frequency $F_{SW}$. Higher switching frequencies typically yield lower impedance, and vice versa. In this embodiment, impedance line 266 has a shallower slope or lower impedance than impedance line 262. Impedance line 266 may be implemented by raising the switching frequency $F_{SW}$ for impedance line 262 from $F_{SW\text{-}BASE}$ to $F_{SW\text{-}H}$. In this embodiment, $F_{SW\text{-}H}$ is devised to adjust the impedance line 266 to contain point 268, which is an exemplar desired operating point having a desired voltage $V_{OUT}$ and a desired current $I_{OUT}$. As those of skill in the art will understand after appreciating this specification, if the desired $V_{OUT}$ and $I_{OUT}$ combination for a particular operating condition do not lie on an existing impedance line attainable by the DIM control process employing a particular switching frequency $F_{SW}$, then small adjustments in the switching frequency $F_{SW}$ of capacitor(s) in one or more phases may further modulate the impedance. As another example, impedance line 264 may be achieved by lowering $F_{SW\text{-}BASE}$ to $F_{SW\text{-}L}$ which is devised to achieve a higher impedance. The relationship of the switching frequencies depicted in graph 26B is characterized by equation 2.

$$F_{SW\text{-}L} < F_{SW\text{-}BASE} < F_{SW\text{-}H} \quad (2)$$

Figure 27:
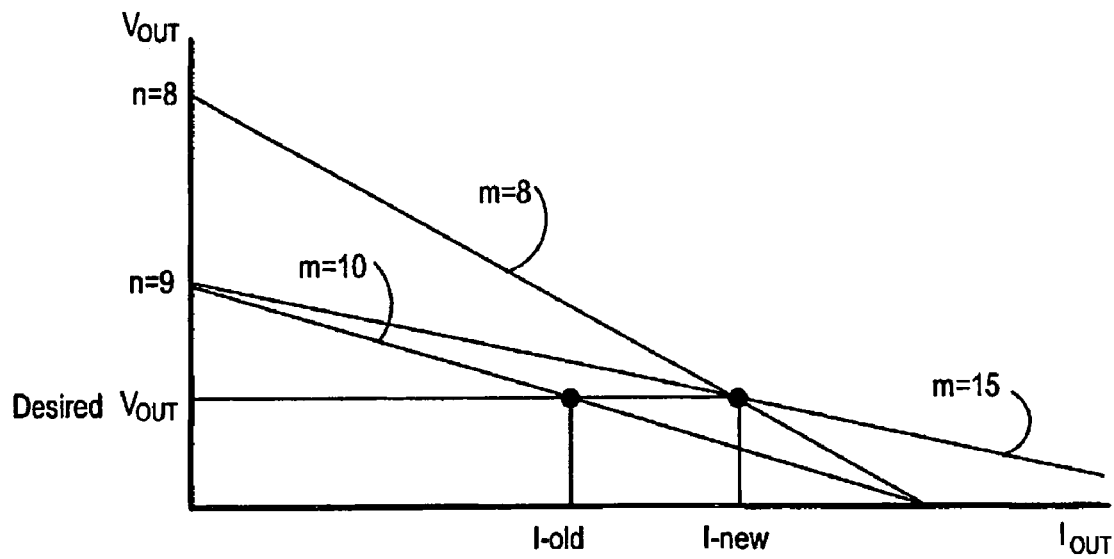
FIG. 27 depicts impedance lines showing "load regulation" capabilities that may be provided by some embodiments of the present invention.

FIG. 27 depicts impedance lines showing "load regulation" capabilities of the digital impedance modulation systems and methods according to an embodiment of the present invention. Load regulation is the ability of a power supply system to maintain a specified output voltage $V_{OUT}$ as a load's desired current $I_{OUT}$ changes. In this embodiment, load regulation is achieved by dynamically reconfiguring power stage 28 (not shown in this Figure). Such reconfiguration, driven by control stage 27, is implemented in this embodiment by changing the value of m and/or n by adding or removing phases 32 and/or capacitors $C_f$ in one or more phases 32, respectively. The impedance lines in FIG. 27 depict an exemplar operating configuration having parameters that meet the conditions in equations 3 and 4.

$$\text{I-new} > \text{I-old} \quad (3)$$

$$V_{OUT}\text{-new} = V_{OUT}\text{-old} \quad (4)$$

Further, FIG. 27 depicts an exemplar starting state condition of n=9 and m=10, for power stage 28 to meet exemplar $V_{OUT}$ and $I_{OUT}$ operating requirements of a load 22. In this exemplar, when the load 22 current demand increases to I-new, the two state conditions shown in Table 2 would enable power stage 28 to meet the $V_{OUT}$-new/I-new operating requirement.

TABLE 2

Possible state values to meet new load requirements

| State 1: | n = 8 | m = 8 |
|---|---|---|
| State 2: | n = 9 | m = 15 |

Referring still to FIG. 27 and Table 2, in this embodiment, control stage 27 (not shown in this Figure) applies optimization algorithms which typically select and implement State 2 for power stage 28 since State 2 would typically provide higher efficiency and lower impedance than State 1. In an alternative exemplar operating environment in which converter 20 simultaneously supplies multiple loads, some of which might require higher or more dynamic currents, the controller may select and implement State 1. Such a selection would require fewer of converter 20's system resources such as, for example, capacitors $C_f$, thereby enabling control stage 27, with the exemplar n and m values in Table 2, to "reserve" 71 capacitors $C_f$ for re-allocation to other loads if required.

Figure 28:
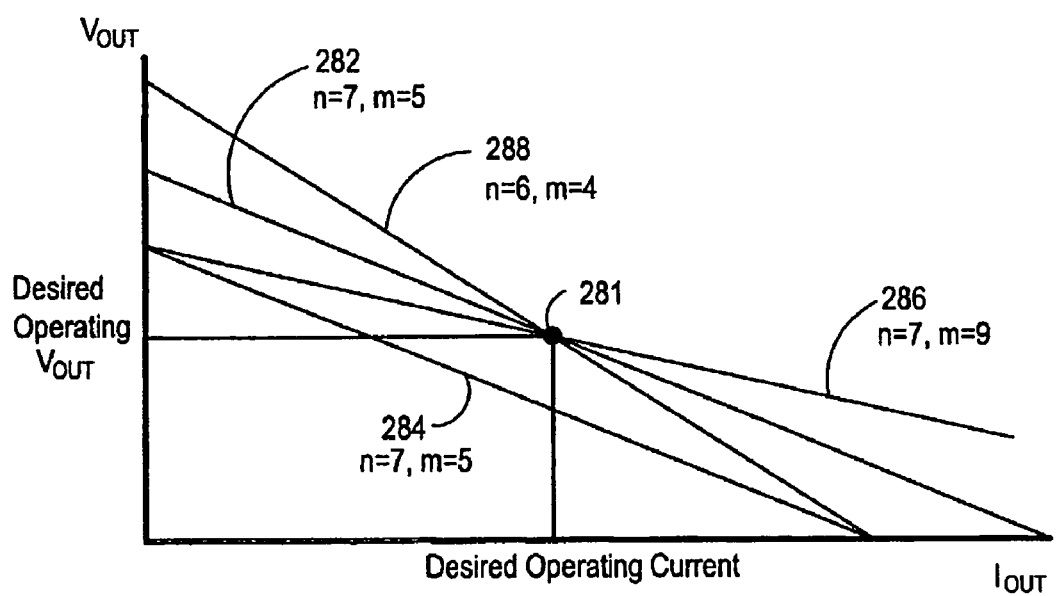
FIG. 28 depicts impedance lines showing "line regulation" capabilities that may be provided by some embodiments of the present invention.

FIG. 28 depicts impedance lines showing "line regulation" capabilities of the digital impedance modulation systems and methods according to an embodiment of the present invention. Line regulation is the ability of a power supply system to maintain a specified output voltage as its input voltage changes. In this embodiment, similar to the load regulation techniques described with regard to FIG. 27, line regulation is implemented by changing the value of 'm' and/or 'n' in the power stage 28 (no shown in this Figure). Line regulation (and load regulation) may further be implemented by updating switching frequencies $F_{SW}$ as described with regard to FIG. 26.

In contrast to load regulation requirements, where a load 22's current change is typically reflected as a horizontal re-positioning on an impedance line graph (FIG. 27), changes in converter 20's input voltage are typically reflected by a vertical re-positioning on an impedance line graph (FIG. 28). When such changes occur, control stage 27 typically minimizes or eliminates the vertical shift to maintain the affected load 22's operating requirements such as, for example, the specified output voltage. The exemplar operating state and conditions depicted in FIG. 28 are further described by the parameters in Table 3.

TABLE 3

Old and New State Values for FIG. 28

| $V_{IN}$-old |  | 12 V |  |
|---|---|---|---|
| State 0: | N = 7 | m = 5 | Impedance Line 282 |
| $V_{IN}$-new |  | 10.8 V |  |
| State 0: | N = 7 | m = 5 | Impedance Line 284 |
| State 1: | N = 7 | m = 9 | Impedance Line 286 |
| State 2: | N = 6 | m = 4 | Impedance Line 288 |

Referring still to FIG. 28 and Table 3, in this exemplar operating sequence, control stage 27 sets the State 0 conditions of Table 3 to configure power stage 28 to meet load 22's required voltage and current using $V_{IN}$-old as the input voltage to power stage 28. Such allocation causes power stage 28 to operate on impedance line 282 containing the desired operating point 281. In this exemplar, while selected phases 32 operate with State 0 configuration, the input voltage to power stage 28 drops 1.2V, from 12V to 10.8V. Such input voltage drops may result from changes in the system operating environment, such as, for example, drops in battery voltage or additional loads being supplied by a power source. As the input voltage starts to drop, the selected phases 32 of power stage 28 can no longer maintain an output operating point 281 on line 282, and the output voltage starts to drop to impedance line 284.

Control stage 27 recognizes two state conditions, State 1 and State 2, that converter 20 may implement to maintain specified output voltage and current at point 281 with the new input voltage, $V_{IN}$-new=10.8V. In the absence of multi-load resource allocation considerations, control stage 27 selects State 1 to present lower impedance to the load and operate with higher efficiency, similarly to the selection described with regard to above-referenced FIGS. 25 and 27. Further, as described with regard to FIG. 26, control stage 27 may implement small frequency adjustments to improve power stage 28 impedance granularity in a manner devised to produce load 22's required operating voltage and current point.

Figure 29:
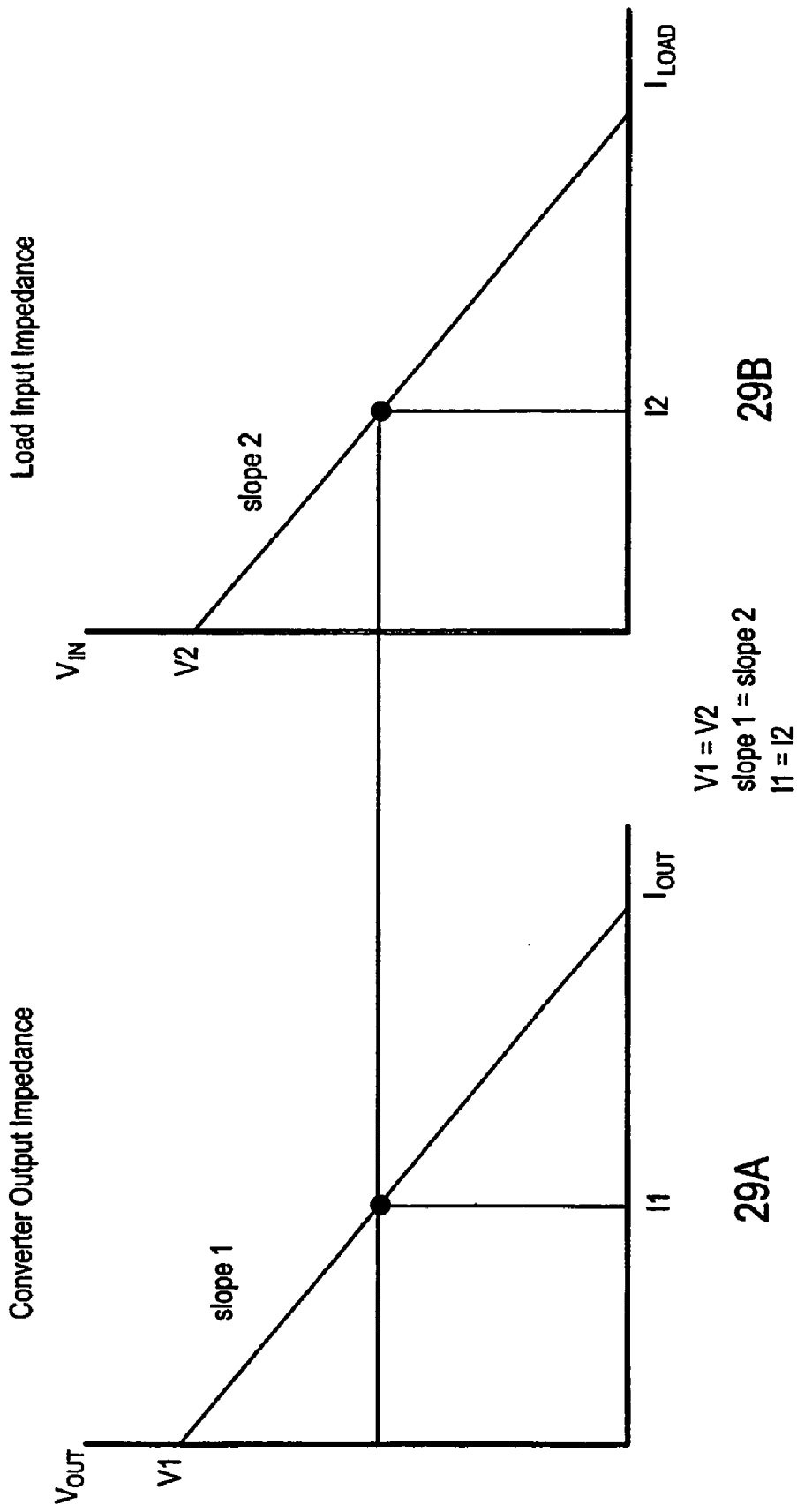
FIG. 29 depicts impedance lines showing "open-loop control" capability that may be provided by some embodiments of the present invention.

FIG. 29 depicts impedance lines showing "open-loop control" capability according to another embodiment of the present invention. In this alternative embodiment, no sensing or feedback signals, such as, for example, $V_{SENSE}$ and $V_{ID}$ described above with reference to FIG. 2, are typically required to drive control processes in control stage 27. Instead, the output impedance of the system's power stage 28 can be matched to load 22's pre-determined input impedance line, thereby providing an inherent (or "open-loop")

control architecture. Many application ICs, which converter system 20 may supply as a load 22, are designed to operate along a fixed impedance line. Such application ICs typically operate with a pre-determined input impedance that is often equal to the impedance between the IC's power pins and the actual active circuitry on the IC die. Typically, a pre-determined IC input impedance is dominated by packaging interconnect and socket parasitics. An exemplar input impedance line for an application IC or load 22 is shown in graph 29B. The control stage 27's control processes according to some embodiments of the present invention may operate the converter 20's power stage 28 across a wide range of impedance lines. These processes may select a matching impedance line, such as the exemplar shown in graph 29A, on which to operate. In other embodiments, a converter 20 may be designed to perform with a particular type of load 22 or family of application ICs, and may therefore be configured to operate with a selection of available impedance lines that will tend to match those of the target loads 22 or application ICs. Operating converter 20 on a matching impedance line with load 22 typically reduces the need for load regulation because converter 20's output voltage will typically change immediately and automatically as load 22's demand for current changes.

Graph 29A shows an impedance line selected by control stage 27 to match the input impedance line of load 22 shown in graph 29B. Converter 20's output voltage, $V_1$, results from dividing the input voltage based on the number of capacitors $C_f$ used to form a phase. For example, with a 12V input voltage across a 6-capacitor phase, $V_1$ equals approximately 12V/6V (2V). Further, the number of impedance lines governing converter 20's operation with regard to a particular load 22 is equal to the number of capacitors $C_f$ comprising a phase 32 selected for connection to that particular load 22. For example, a 6-capacitor phase 32 can operate along 6 distinct impedance lines. In such an exemplar embodiment, a low number of available impedance lines may constrain implementation of the "impedance matching" open-loop control process since insufficient converter granularity would exist to match the wide range of possible load impedance lines. Preferably, the impedance line exemplified in graph 29A is devised to match that of 29B from the point Iout=0 to a maximum output current. One or more closed-loop regulators may be inserted at the input in series with converter's phase(s) 32, the regulator(s) devised to ensure a proper output voltage produced by selected phase 32 when $I_{OUT}$ is 0 amps.

The digital impedance modulation (DIM) control techniques and schemes described herein may be implemented across a wide range of converter topologies and circuits in which a fixed or near-fixed output impedance is achieved for a specified combination of switching frequency and switch size. For such converter topologies and circuits, a control process employing some or all of the digital impedance modulation techniques described herein may help ensure a more constant efficiency across a load's range of operating currents. Further, the digital impedance modulation control schemes may operate at a constant fundamental frequency component, thereby enhancing their appeal in interference-sensitive applications such as, for example, RF and communication-based applications.

Figure 30:
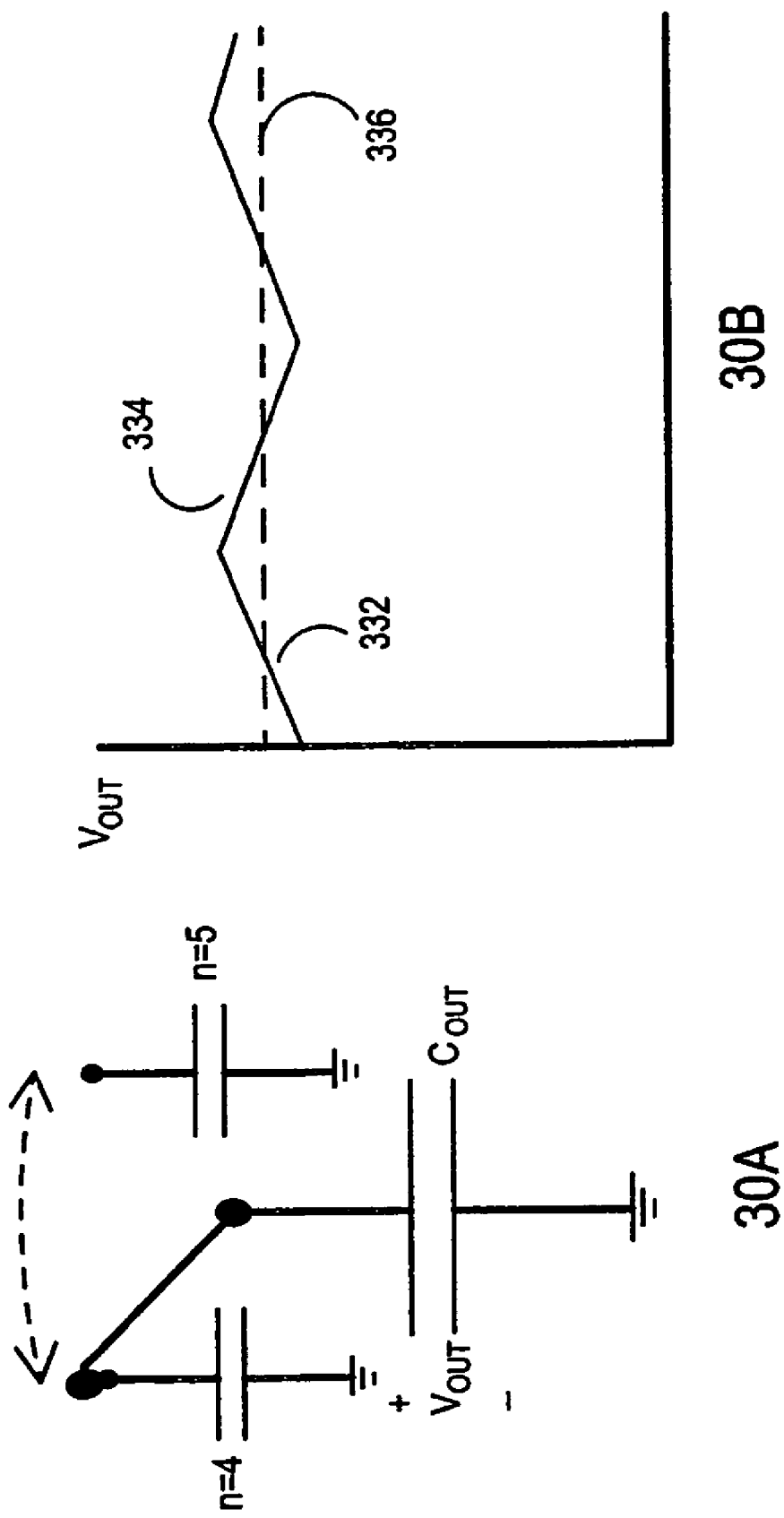
FIG. 30 depicts a voltage averaging scheme that may be provided by some embodiments of the present invention.

FIG. 30 depicts a voltage averaging scheme according to another embodiment of the present invention. Voltage averaging represents an additional control technique for achieving higher operating granularity with regard to a converter system's available impedance lines. In this exemplar, the two capacitor circuit elements marked as n=4 and n=5, depicted in FIG. 30A are an abstracted representation of two phases 34 configured with 4 and 5 capacitors, respectively. While only one capacitor is shown for each phase 34, this is to simplify the depiction and all the capacitors $C_f$ of each phase 34 are employed in this descriptive exemplar. The two phases, marked as n=4 and n=5, are depicted as being connected to capacitor $C_{OUT}$ in an anti-phased configuration. That is, one phase 34 is switched to discharge to load 22 or output capacitor $C_{OUT}$ while the other is switched off-line and preferably enters its charging phase. Such switching operation may be achieved by operation of P5 switches in each block as described with regard to above referenced Figures, especially FIG. 4–5. During the next half-period of switching frequency $F_{SW}$, this arrangement is reversed. Graph 30B depicts the voltage across capacitor $C_{OUT}$ over time. During discharge operation of phase n=4, $C_{OUT}$'s voltage will be pulled up as depicted by waveform portion 332. During discharge of phase n=5, $C_{OUT}$'s voltage will be pulled down as depicted by waveform 334. Through extended operating periods, $C_{OUT}$'s output voltage will preferably move to a steady state level 336 between the output voltage of the two phases. Level 336 which will be determined by the relative impedance of the two phases 34. While in this example two phases 34 are depicted as implementing voltage averaging, the voltage averaging methodology can be implemented using a large number (two or more) of phases 34 and these phases can each be comprised of varying numbers of capacitors $C_f$. In such cases, the "duty cycle", the portion of the period of switching frequency $F_{SW}$ allocated for each phase to discharge, would preferably be equally divided among the multiple phases. However, this is not limiting and phases 34 may be interleaved and/or overlapped according to a variety of schemes. Those of skill in the art will understand, after appreciating this specification, that the voltage averaging scheme described herein can be employed to advantage in various combinations with the other control techniques described herein.

Figure 31:
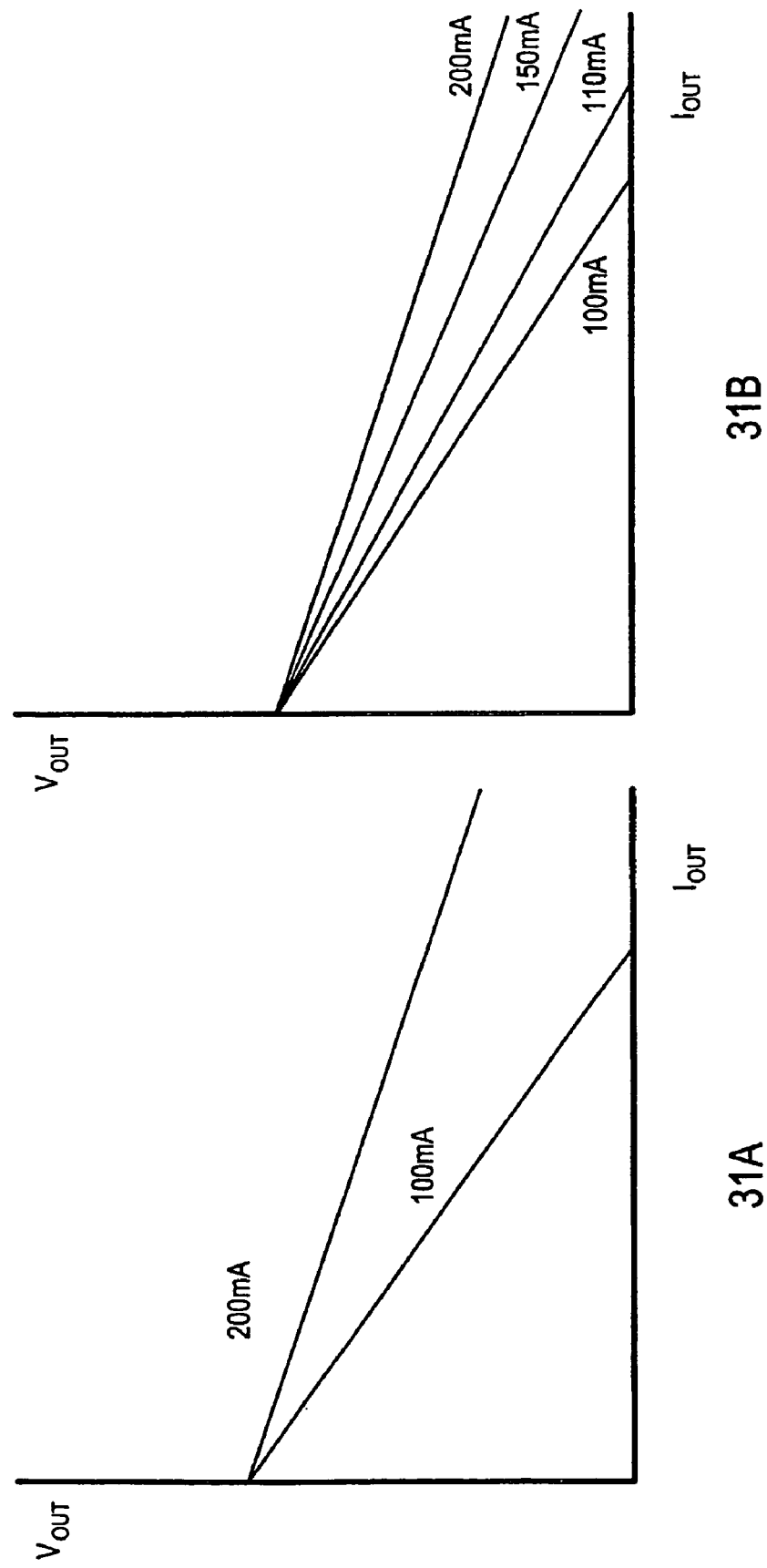
FIG. 31 depicts a phase-sizing scheme for increasing the granularity of the converter output voltage that may be provided by some embodiments of the present invention.

FIG. 31 depicts a phase-sizing scheme for increasing the granularity of the converter output voltage according to another embodiment of the present invention. Phases of varying sizes may be combined in a scheme devised to increase the number of impedance lines available for converter 20's operation. Graph 31A depicts impedance lines according to one embodiment of the present invention in which a converter 20 employs phases of uniform size of 100 mA each in this descriptive exemplar. In this exemplar graph, the impedance lines available for converter 20's operation are spaced 100 mA apart. In contrast, graph 31B depicts impedance lines of another embodiment of the present invention. This converter 20 employs multiple phases sized at 50 mA/phase and multiple phases sized at 10 mA/phase. In this exemplar embodiment, the converter 20's control stage 27 has substantially more impedance lines from which to operate when compared to a converter based on uniform phase sizing as depicted in graph 31A. For example, this converter 20 may operate on the 100 mA impedance line by combining two 50 mA phases to discharge in parallel. Further, this converter 20 may operate on the 110 mA impedance line by combining two 50 mA phases and one 10 mA phase to discharge in parallel. This exemplar is not limiting, and many more impedance lines may be achieved by combining differently-sized phases in parallel. For example, phases 32 could be sized according to a binary scheme in which 20 mA, 40 mA, 80 mA, 160 mA phases may be combined in various ways to achieve high granularity of operating voltages and impedance lines. Phase sizes may be changed by implementing phases 32 with different sizes of capacitors $C_f$. Those of skill in the art will understand, after appreciating this specification, that the phase-sizing scheme described herein can be employed to advantage in various combinations with the other control techniques described herein.

FIG. 32 depicts low-voltage-switching characteristics according to a preferred embodiment of the present invention. Power consumption ($P_{LOSS}$) by a semiconductor switch may be described by equation 5.

$$P_{LOSS}=V_{DS}*I_{DS} \qquad (5)$$

The architecture and operation of preferred embodiments of the present invention, described with regard to above-referenced Figures, especially FIG. 3, minimizes power consumption during switching operations and avoids or mitigates subjecting the semiconductor switches to the effects of hot carrier injection (HCI). This is achieved by designing the phase 32 to accommodate low-current-switching (LCS) on a majority of the semiconductor switches used in every phase 32 and low-voltage-switching (LVS) employed on the remainder of the semiconductor switches in each phase 32. In operation of preferred embodiments of the invention, immediately prior to activation of semiconductor switch P1, $V_{DS}$ across semiconductor switch P1 is typically equal to $V_{OUT}$ and is therefore typically low relative to $V_{IN}$. Semiconductor switches P4, and P5 would, however, without the use of semiconductor switch P3 according to the sequence described with reference to FIG. 3, be activated with a high $V_{DS}$. Further, semiconductor switch P2 would, without the prior activation of semiconductor switches P1 (described with reference to FIG. 3) be activated with a high $V_{DS}$. Such a condition is depicted in graph 32A, which shows the voltage and current waveforms of a switch activated at time 352. In this graph, the power consumption, described by equation 5, is high. Although semiconductor switch P2 is activated at a different time than switches P4 and P5, its operation without LVS may be characterized by graph 35(a).

Graph 32B shows voltage and current waveforms for a semiconductor switch employed with a preferred implementation of the LVS scheme of the present invention. At time 354, the LVS switching sequence activates switches P1 (charge cycle) and P3 (discharge cycle) to lower the $V_{DS}$ voltage of the respective switches, P2 (charge cycle) or P3 and P4 (discharge cycle). After the $V_{DS}$ voltage has dropped substantially, the respective switches are activated at time 356, and their operation exhibits the lower power consumption characteristics shown in graph 35(b).

FIG. 33 depicts low-current-switching characteristics according to a preferred embodiment of the present invention. In general, switch deactivation when current flow across the switch is zero or near zero greatly reduces switching losses. Such operation may be referred to as low-current-switching (LCS). A semiconductor switch operated without LCS may be characterized by graph 33A, and has high switching losses when the semiconductor switch is deactivated at time 362. In a preferred embodiment of the invention, during a phase 32's charge phase, charging semiconductor switches P2 and P1 are deactivated when the voltage on the flying capacitors $C_f$ is sufficiently high, i.e., when charging current is minimized. Likewise, during the discharge phase, semiconductor switches P4 and P5 are deactivated when the current across them is low, i.e., when the voltage on the capacitors $C_f$ approaches the output voltage. Such operation with regard to charging and discharging implements LCS and thereby reduces switching losses in preferred embodiments of the present invention. LCS operation may be characterized by graph 33B.

Figure 34:
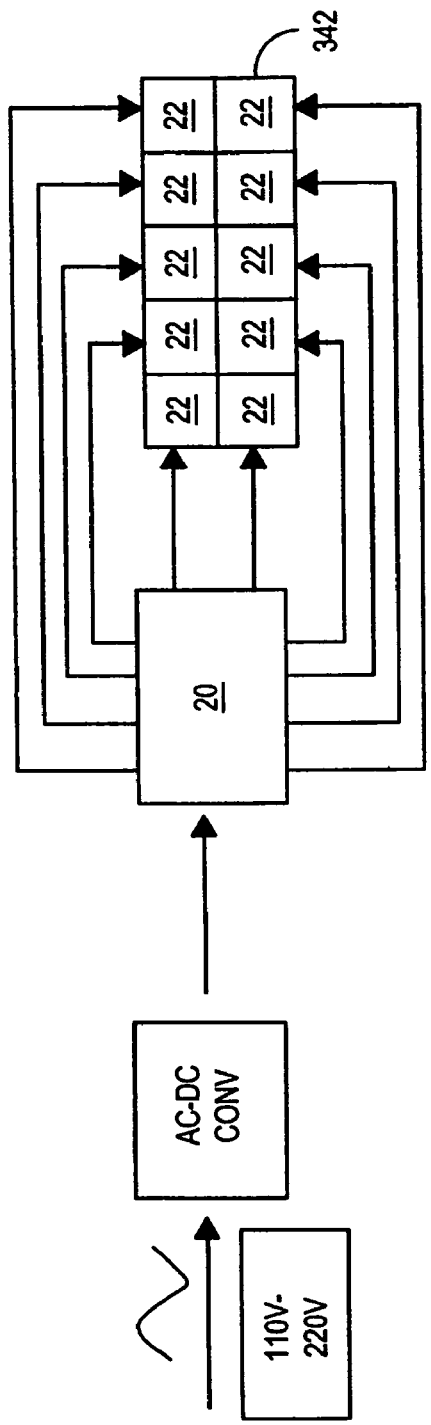
FIG. 34 depicts a converter system configured to supply multiple loads according to another embodiment of the present invention.

FIG. 34 depicts a converter system configured to supply multiple loads according to another embodiment of the present invention. Converter system 20 is shown with its power stage 28 (not separately numbered) supplying several loads 22. In this embodiment, converter system 20 is configured as a point-of-load DC-to-DC converter. In this embodiment, power connections to the several loads 22 may be implemented as described with regard to above referenced Figures, especially FIGS. 4 and 5. Depicted loads 22 are all part of IC 342 and may be power domains and/or power "block" constituents of IC 342 such as, for example, floating point unit, arithmetic logic units, macro interpreters, memory managers, and others. In this embodiment and similar multi-load embodiments, the operating voltage of each load 22 (which may be referred to as "block 22" with reference to FIG. 34) may be adjusted to provide, for each of the blocks 22 on IC 342, a voltage devised for optimized block-by-block performance and may reduce the need for multiple POL power supplies in such situations where multiple voltages are required by an IC. By providing a customized power supply input to each block 22, each block 22's voltage may be optimized at any given time to meet the performance required of that block 22 for a given application program. A higher required performance may call for higher voltage, while lower voltages may be provided when lower performance (or sleep-state) is acceptable. Such a managed power supply scheme may reduce power consumption and provide benefits in mitigating/eliminating thermal management challenges. Such a managed power supply scheme may also, when employed with a mixed-signal IC comprising both digital and analog blocks, provide an isolation mechanism for reducing interference from electromagnetic noise, such as, for example, that produced by digital blocks, crossing into sensitive analog blocks. Further, phases 32 may be allocated dynamically in response to block-level voltage requirements in response to the IC providing feed-forward and/or feedback digital input to control stage 27 regarding block-level requirements.

By combining the converter 20's ability to simultaneously supply multiple power domains on a single IC with its fast transient response, the control algorithms and schemes of the present invention may operate to reduce or eliminate input voltage to each power domain on the IC when, for example, operation of the functional block 22 is not required. Such operation may reduce, at the block-level and/or IC-level, the static power consumption attributable to leakage. In embodiments of the invention configured to operate at high switching frequencies, such as, for example, 100 MHz, the output voltage can be reduced or blocked as required, and may be restored within a few nanoseconds, as may be required for ICs operating at GHz frequencies. Voltage reduction may be achieved by allocating additional capacitors $C_f$ to a phase, while voltage blocking may achieved by adding a series pass transistor between the converter 20's output capacitor $C_{OUT}$ and an IC block's input pin or contact. In such an embodiment, the pass transistor is de-activated when operation of the selected IC block is not required.

Figure 35:
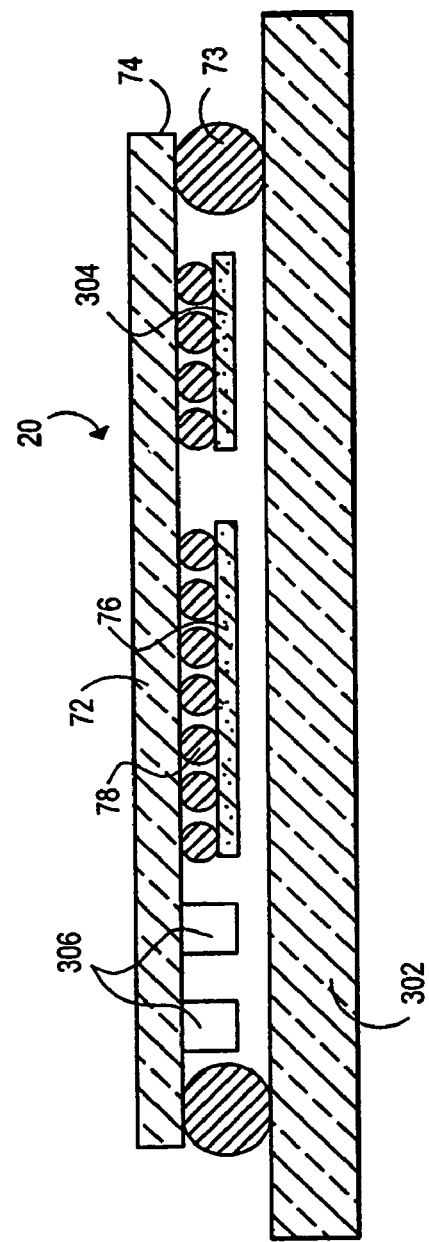
FIG. 35 is a cross-section of an alternative embodiment of the present invention showing an alternative packaging scheme.

FIG. 35 is a cross-section of an alternative embodiment of the present invention showing an alternative packaging scheme from the preferred embodiment shown in FIG. 7. This embodiment provides system designers with the option of placing application IC 304, which is an embodiment of load 22, in a co-packaged arrangement with power module 72. One embodiment of power module 72 is described in detail with reference to FIG. 7, and similarly numbered parts in FIG. 35 may retain their described features with additional description being made with reference to FIG. 35. Signal and power traces for application IC 304 are, in this embodiment, fabricated as part of power module 72. Power management IC 76 provides control and switching capabilities to converter system 20. Discrete elements 306 may be various discrete active or passive devices, part of the converter system 20 or other devices associated with the application IC 304, such as, for example, capacitors, resistors, transistors, inductors, diodes, even small, special function ICs. In this embodiment, discrete elements 306 are output capacitors $C_{OUT}$ for converter system 20. Alternatively, capacitors $C_{OUT}$ may be implemented similarly to capacitors $C_f$ (not shown in this Figure) formed on substrate 74. Application IC 304 may be connected proximal to an output capacitor or a power trace on power module 72 in a manner devised to minimize power trace length. Application IC 304 may be any type of IC, and may be disposed in a non-packaged mounting scheme such as, for example, bare-die flip-chip mounting, or may be disposed in an IC package such as, for example, ball-grid-array (BGA), micro-ball-grid array, and fine-pitch ball grid array (FBGA) packages or packages with pin leads. Further, application IC 304 may be one or more of many different types of ICs employed for a variety of purposes, such as, for example, digital-signal-processors, field-programmable gate arrays, application-specific ICs, and microprocessors. Power module 72 is connected to application board 302 through solder balls 73. While solder balls are shown in this exemplar Figure, they are not limiting and the invention may be practiced using a variety of leaded or non-leaded connection schemes.

Figure 36:
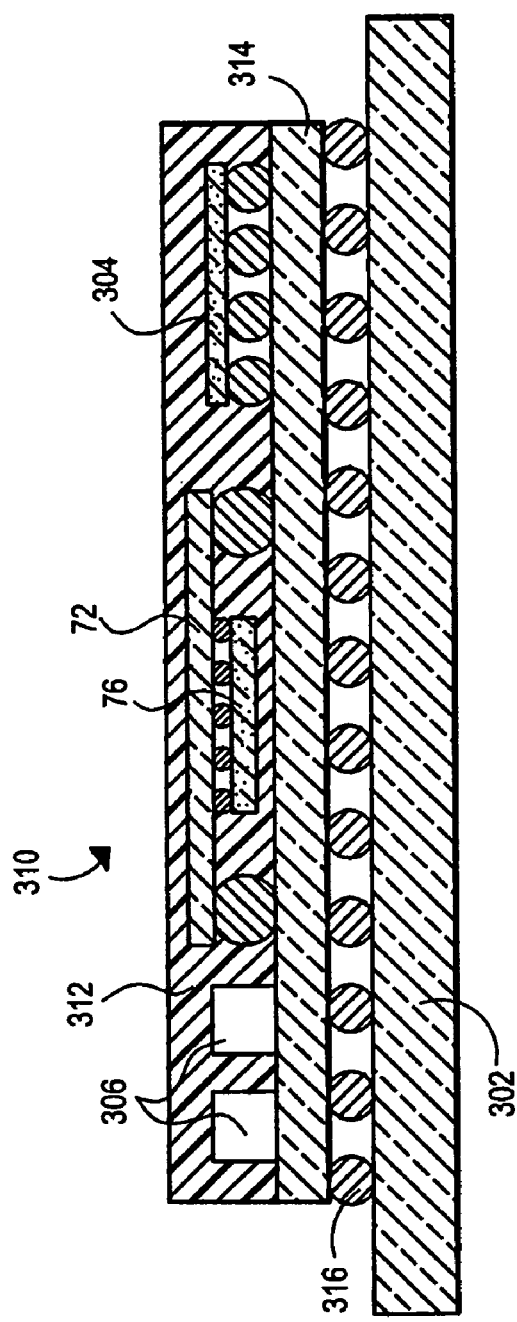
FIG. 36 depicts a System-in-Package implementation according to another embodiment of the present invention.

FIG. 36 depicts a System-in-Package (SIP) implementation according to one embodiment of the present invention. In this embodiment, power module 72 (FIG. 7) is co-packaged with application IC 304 to create a single package for mounting on application board 302. Power management IC 76 (an example of which was shown in FIG. 7) interconnects to/from application IC 304 through interposer substrate 314, which provides signal and power traces. Further, interposer substrate 314 provides connections to the operating environment through leads 316. While leads 316 are shown as BGA balls, this is not limiting and leads 316 may be any of a variety of connecting structures such as, for example, bumps, solder bumps, or pin leads. Further, while a particular layout is shown in this exemplar Figure, this layout is not limiting and the layout of components according to this embodiment may take many forms. For example, discrete elements 306 may be located proximally to application IC 304. Further, while discrete elements 306 may be output capacitors in some embodiments, they may also be other discrete elements, and capacitors $C_{OUT}$ may instead be implemented similarly to capacitors $C_f$ formed on power module 72 as described with reference to FIG. 7. Encapsulant 312 encloses the components mounted on interposer substrate 314. Encapsulant 312 may be any of a number of materials devised for protection, insulation or encasing of semiconductor elements, such as, for example, plastic.

Figure 37:
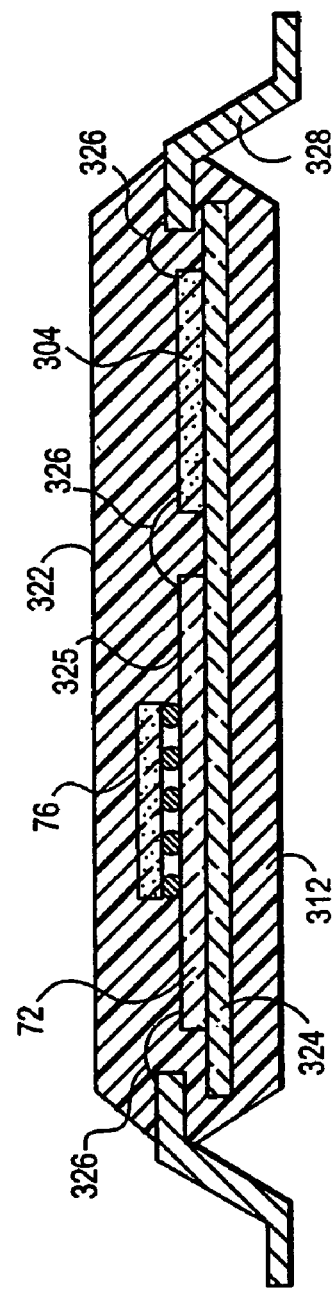
FIG. 37 depicts a leadframe co-packaging scheme of yet another embodiment of the present invention.

FIG. 37 depicts a leadframe co-packaging scheme of yet another embodiment of the present invention. In this embodiment, power module 72 (an example of which was shown in FIG. 7) is co-located with application IC 304 in a standard IC leadframe package 322. Package 322 may have a variety of form factors, such as, for example, TSOP, TSSOP, SSOP, LQFP, PLCC, MQFP, MLF, SOIC, and PDIP. Power module 72 is mounted on die-attach pad 324. In this embodiment, power module 72 is inverted in orientation as compared to the other exemplar embodiments shown in FIGS. 7 and 30–31. Power management IC 76 is mounted to upper surface 325 of power module 72. Upper surface 325 presents capacitor $C_f$ electrode contacts (not shown in this Figure) for connection to power management IC 76. In this embodiment, wire bonds 326 provide power and signal connections between power module 72 and package leads 328. Further, wire bonds 326 provide power and signal connections between power module 72 and package leads 328.

Figure 38:
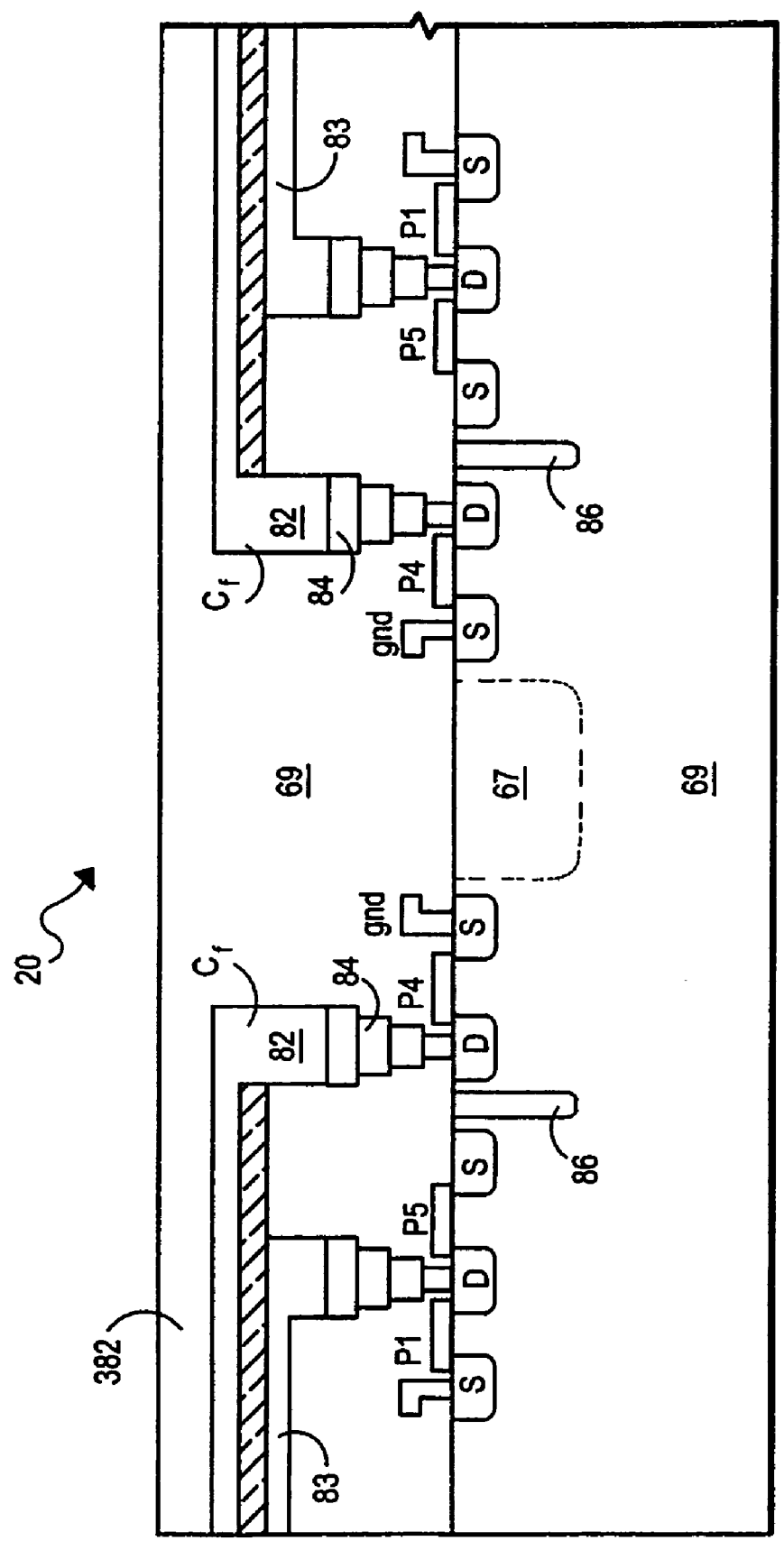
FIG. 38 is a cross-section diagram depicting a portion of a converter-on-a-chip according to yet another embodiment of the present invention.

FIG. 38 is a cross section diagram depicting a portion of a converter-on-a-chip according to yet another embodiment of the present invention. In this embodiment, converter system 20 is formed on a single IC 382 including control stage 27 and power stage 28. IC 382 and capacitors $C_f$ may be made using semiconductor processes known in the art, such as, for example, CMOS processes and alternative processes and geometries, including those in which capacitors and resistors may be formed in vertical trenches, or in which the capacitors are of the MIM or PIP types, and/or floating plate capacitors types. Further, such alternative processes and geometries may apply to appropriate alternative embodiments of the "direct module attach" (an example of which is described with reference to FIGS. 8–9) or other embodiments of converter system 20. In this embodiment, substrate 69 contains capacitors $C_f$ and semiconductor switches P1–P5. Capacitors $C_f$ are disposed, in this embodiment, in a manner devised to place capacitor electrode access sites 82 and 83 near respective semiconductor switches P1–P5, with IC connectives 84 connecting capacitors $C_f$ to respective semiconductor switches P1–P5. In other embodiments, IC connectives 84 may include horizontal traces and may be disposed in a horizontal distribution layer. Further, in other embodiments, system 20's control logic need not be grouped in a single control logic area 67, but may be dispersed between capacitor $C_f$ structures or disposed in a variety of other layouts with appropriate connective traces. In various embodiments capacitors $C_f$ may be disposed in layouts such as, for example, a grid layout, an arcuate layout such as the example described with reference to FIGS. 7–8, and others.

IC 382 may be packaged in a variety of ways known in the art, such as, for example, in a pin-leaded package with wire bonds and a lead frame or in a BGA package. Further, in other alternative embodiments, IC 382 may be connected to its operating environment in a flip-chip, bare die arrangement. In still further alternative embodiments, load(s) 22 may be included in IC 382. Such alternative embodiments may be made by a process facilitated for a variety of applications and industries with the use of a core-design module containing design and layout data for integration with the IC designs of application ICs to produce IC 382 with the application IC (an embodiment of load 22) co-located with converter system 20.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

We claim:

1. A switched-capacitor power supply comprising:
   (a) a plurality of thin-film capacitors each one of said plurality of thin-film capacitors being disposed substantially along a first plane and elongated to have a first end and a second end;
(b) a power management integrated circuit for controlling the switched-capacitor power supply;
(c) a plurality of semiconductor switches, each selected one of which plurality of semiconductor switches being connected to one or more selected ones of the plurality of thin-film capacitors;
(d) a plurality of connective structures, each selected one of which plurality of connective structures being disposed to connect each selected one of the plurality of semiconductor switches to the one or more selected ones of the plurality of thin-film capacitors while being disposed substantially along one of a plurality of respective axes that are disposed in an orientation that is substantially normal to the first plane.

2. The switched-capacitor power supply of claim 1 in which the plurality of semiconductor switches is comprised of a charge group of semiconductor switches that when switched cause charge to flow into selected ones of the plurality of thin-film capacitors and a discharge group of semiconductor switches that when switched cause charge to flow out of selected ones of the plurality of thin-film capacitors.

3. The switched-capacitor power supply of claim 1 in which the plurality of thin-film capacitors are arranged about a grouping point so that the first end of each one of the plurality of thin-film capacitors is closer to the grouping point than is the second end.

4. The switched-capacitor power supply of claim 2 in which the plurality of thin-film capacitors are arranged about a grouping point so that the first end of each one of the plurality of thin-film capacitors is closer to the grouping point than is the second end.

5. The switched-capacitor power supply of claim 3 in which the plurality of thin-film capacitors are arranged in an arcuate disposition about the grouping point.

6. The switched-capacitor power supply of claim 4 in which the plurality of thin-film capacitors are arranged in an arcuate disposition about the grouping point.

7. The switched-capacitor power supply of claim 6 in which the arcuate disposition is a circular disposition.

8. The switched-capacitor power supply of claim 1 in which each one of the plurality of connective structures comprises a via.

9. The switched-capacitor power supply of claim 2 in which each one of the plurality of connective structures comprises a via.

10. The switched-capacitor power supply of claim 8 in which the via is a stacked via.

11. The switched-capacitor power supply of claim 9 in which the via is a stacked via.

12. The switched-capacitor power supply of claim 1 in which each one of the plurality of connective structures comprises a stacked via and a ball contact.

13. The switched-capacitor power supply of claim 2 in which each one of the plurality of connective structures comprises a stacked via and a ball contact.

14. The switched-capacitor power supply of claim 1 in which the plurality of connective structures are integrated with the power management integrated circuit.

15. The switched-capacitor power supply of claim 6 in which the plurality of connective structures are integrated with the power management integrated circuit.

16. The switched-capacitor power supply of claim 3 in which the power management integrated circuit is devised in a flip-chip construction and the plurality of thin-film capacitors and the power management integrated circuit are disposed relative to each other to establish a direct connection between the plurality of thin-film capacitors and respective ones of the plurality of connective structures integrated with the power management integrated circuit.

17. The switched-capacitor power supply of claim 4 in which the power management integrated circuit is devised in a flip-chip construction and the plurality of thin-film capacitors and the power management integrated circuit are disposed relative to each other to establish a direct connection between the plurality of thin-film capacitors and respective ones of the plurality of connective structures integrated with the power management integrated circuit.

18. The switched-capacitor power supply of claim 3 in which each one of the plurality of thin-film capacitors has a first and a second access point at its respective first end and the power management integrated circuit is devised in a BGA package that is surface mounted to contact the first and second access points of each of the plurality of thin-film capacitors.

19. The switched-capacitor power supply of claim 4 in which each one of the plurality of thin-film capacitors has a first and a second access point at its respective first end and the power management integrated circuit is devised in a BGA package that is surface mounted to contact the first and second access points of each of the plurality of thin-film capacitors.

20. A switched-capacitor power supply comprising:
(a) a plurality of capacitors formed on a substrate, the capacitors having a plurality of electrodes;
(b) a plurality of charging transistors formed on an integrated circuit;
(c) a plurality of discharging transistors formed on the integrated circuit;
(d) a plurality of conducting structures connecting a plurality of respective terminals of the charging and discharging transistors to respective ones of the capacitor electrodes, the conducting structures having an equivalent series resistance of less than 10 milliohms.

21. The switched-capacitor power supply of claim 20 wherein the conducting structures have a partial inductance of less than 50 pico-henries.

22. The switched-capacitor power supply of claim 20 wherein the conducting structures comprise bumps.

23. The switched-capacitor power supply of claim 20 wherein the conducting structures comprise vias.

24. The switched-capacitor power supply of claim 20 wherein the conducting structures comprise stacked vias.

25. The switched-capacitor power supply of claim 20 wherein the capacitors are thin-film capacitors.

26. The switched-capacitor power supply of claim 20 wherein the capacitors have a equivalent series inductance of less than 1 pico-henry.

27. The switched-capacitor power supply of claim 20 wherein the capacitors have a equivalent series resistance of less than 100 milliohms.

28. The switched-capacitor power supply of claim 20 wherein a plurality of the capacitors are elongated and have a proximal end, the proximal ends being grouped near the integrated circuit.

29. The switched-capacitor power supply of claim 20 wherein the charging and discharging transistors have a gate capacitance of less than 2 pico-farads.

30. The switched-capacitor power supply of claim 20 wherein the charging and discharging transistors are N-channel FETs.

31. A method of charging and discharging a plurality of capacitors in a switched-capacitor power supply, the method comprising:
- (a) applying a charging current to the capacitors through a plurality of charging transistors on an integrated chip, the charging transistors arranged in a layout such that a plurality of respective terminals of the respective charging transistors are disposed above a portion of a plurality of respective electrodes of the plurality of capacitors;
- (b) applying an output current from the capacitors through a plurality of discharging transistors on the integrated chip, the discharging transistors arranged in a layout such that a plurality of respective terminals of the respective discharging transistors are disposed above a portion of a plurality of respective electrodes of the plurality of capacitors.

32. A power supply system comprising:
- (a) at least one phase comprising:
  - (i) a plurality of thin-film capacitors arranged with an at least one P1 transistor electrically between respective adjacent pairs of the plurality of thin-film capacitors connecting the plurality of capacitors in series, the plurality of capacitors each having a positive terminal and a negative terminal;
  - (ii) at least one P2 transistor connecting the positive terminal of at least one of the plurality of capacitors to a voltage input terminal;
  - (iii) at least one P5 transistor connecting the positive terminal of at least one of the plurality of thin-film capacitors to an output terminal; and
  - (iv) a plurality of P4 transistors connecting the respective negative terminals of the plurality of capacitors to a reference potential.
- (b) a controller operatively connected to all of the transistors, the controller operative to switch the transistors between a first charging mode in which all of the P4 and P5 transistors in the phase are de-activated, and a second discharging mode in which all of the P1 and P2 transistors in the phases are de-activated.

33. The power supply system of claim 32 wherein the thin-film capacitors comprise elongated structures arranged having a longitudinal axis oriented to point substantially toward the controller.

34. The power supply system of claim 32 wherein the P1, P2, P4, and P5 transistors are disposed in a layout on a power management IC, the layout substantially matching a layout of a plurality of connecting electrodes of respective thin-film capacitors in a manner devised to place respective terminals of the P1, P2, P4, and P5 transistors substantially along a plurality of axes perpendicular to the longitudinal axes of the thin-film capacitors.

35. The power supply system of claim 32 wherein a layout of the P4 and P5 transistors on a power management IC substantially matches a layout of a plurality of connecting points to their respective thin-film capacitors.

36. The power supply system of claim 32 wherein a layout of the P1 and P2 transistors on a power management IC substantially matches a layout of a plurality of connecting points to their respective thin-film capacitors.

37. The power supply system of claim 32 further comprising a delay-locked loop having an input connected to an oscillator and a plurality of delay stages presenting a plurality of phase-delayed oscillator signals operatively connected to respective ones of the plurality of switched-capacitor phases.

38. The power supply system of claim 32 further including a plurality of P3 transistors connected in parallel with the plurality of P4 transistors and operatively connected to the controller, the controller operable to activate P3 transistors slightly in advance of the P4 transistors, the P3 transistors having an ON resistance substantially higher than an ON resistance of the P4 transistors.

39. The power supply system of claim 32 wherein the P1, P2, P4, and P5 transistors have a gate capacitance of less than 2 pico-farads.

40. The power supply system of claim 32 wherein the P1, P2, P4, and P5 transistors are N-channel FETs.

41. The power supply system of claim 32 wherein the P1, P2, P4, and P5 transistors are FETs having a channel length of about 0.18 micro-meters or less.

42. A method of controlling a switched-capacitor power supply comprising the steps:
- (a) allocating a plurality of thin-film switched-capacitor phases to supply at least one load;
- (b) sensing a difference between a desired load voltage and an actual load voltage;
- (c) in response to a higher desired voltage at a substantially constant load current, allocating at least one additional switched-capacitor phase to the load or removing an at least one capacitor block from at least one of the switched-capacitor phases;
- (d) in response to a lower desired voltage at a substantially constant load current, de-allocating at least one of the switched-capacitor phases or adding at least one capacitor block to an at least one switched capacitor phase.

43. The method of claim 42 further including the steps:
- (a) receiving a required-voltage instruction from the at least one load;
- (b) in response to a difference in the required-voltage instruction and a past-required voltage, allocating or de-allocating an at least one switched-capacitor phase to the load or an at least one capacitor block from at least one of the switched-capacitor phases.

44. The method of claim 42 further including the steps:
- (a) receiving a required-current instruction from the at least one load;
- (b) in response to a difference in the required-current instruction and a past-required current value, allocating or de-allocating an at least one switched-capacitor phase to the load or an at least one capacitor block from at least one of the switched-capacitor phases.

45. A method of operating a switched-capacitor power supply having a plurality of switched-capacitor phases each having a plurality of capacitors, the method comprising the steps:
- (a) de-activating a plurality of P1 transistors connected to a positive terminal of at least one of the capacitors;
- (b) de-activating at least one P2 transistor connecting at least one of the capacitors in each phase of the capacitors to an input supply voltage;
- (c) after de-activating the P1 and P2 transistors in each phase, activating a P3 transistor connecting a negative terminal of each of the capacitors to ground; and
- (d) after activating the P3 transistors, activating a P4 transistor connecting a negative terminal of each of the capacitors to ground and activating a P5 transistor connecting the positive terminal of at least one of the capacitors to an output terminal.

46. The method of claim 45 in which the steps are performed for each phase in an interleaved timing arrangement.

47. The method of claim 45 further including the steps of:
(a) activating the plurality of P1 transistors; and then
(b) waiting until a voltage across the at least one P2 transistor is substantially lowered; and then
(c) activating the at least one P2 transistor.

48. A voltage converter system comprising:
(a) a plurality of capacitors, each having a positive terminal and a negative terminal, arranged in one or more phases with one or more charging switches electrically between respective pairs of the capacitors in each phase;
(b) one or more voltage supply switches connecting the positive terminal of a respective one or more of the plurality of capacitors to a voltage input terminal;
(c) one or more first discharging switches connecting the positive terminal of a respective one or more of the plurality of capacitors to an output terminal for that phase;
(d) one or more second discharging switches connecting the negative terminals of respective ones of the plurality of capacitors to a selected reference potential;
(e) one or more voltage-shifting switches, connected in parallel with the one or more second discharging switches;
(f) a control stage operatively connected to all of the switches, the control stage operative to activate and de-activate selected ones of the switches of a selected phase to change between a first charging mode and a second discharging mode, the control stage operative to activate selected ones of the voltage-shifting switches of the selected phase prior to activating selected ones of the second discharging switches.

49. The voltage converter system of claim 48 in which the control stage is operative to activate the one or more charging switches of the selected phase prior to activating the one or more voltage supply switches of the selected phase.

50. The voltage converter system of claim 48 in which the number of phases is more than one and the control stage is operative to activate the first charging and second discharging modes for selected phases in an interleaved order.

51. The voltage converter system of claim 50 in which the control stage is operative to deactivate selected switches at the end the second charging mode after a charging current becomes substantially lower than an initial charging current.

52. The voltage converter system of claim 50 in the capacitors are thin-film capacitors.

53. The voltage converter system of claim 52 in which the capacitors are formed on a common substrate.

54. The voltage converter system of claim 50 in which the number of phases is 4 or more and the controller is operative to allocate and operate two or more phases to supply at each of two or more power loads.

55. The voltage converter system of claim 54 in which at least two of the two or more power loads are power domains on a single IC.

* * * * *